(12) United States Patent
Nakao

(10) Patent No.: US 6,741,511 B2
(45) Date of Patent: May 25, 2004

(54) SEMICONDUCTOR MEMORY DEVICE

(75) Inventor: Hiroyuki Nakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/247,324

(22) Filed: Sep. 20, 2002

(65) Prior Publication Data

US 2003/0133350 A1 Jul. 17, 2003

(30) Foreign Application Priority Data

Jan. 11, 2002 (JP) ........................................ 2002-004628

(51) Int. Cl.$^7$ ................................................. G11C 7/00
(52) U.S. Cl. .............. 365/201; 365/230.03; 365/230.06
(58) Field of Search ............................ 365/201, 230.03, 365/230.06

(56) References Cited

U.S. PATENT DOCUMENTS 5,726,994 A * 3/1998 Matsuura et al. ............ 365/201
2002/0089879 A1 * 7/2002 Kobayashi et al. .......... 365/201

FOREIGN PATENT DOCUMENTS

JP P2001-176296 A 6/2001

* cited by examiner

*Primary Examiner*—Huan Hoang
(74) *Attorney, Agent, or Firm*—McDermott, Will & Emery

(57) ABSTRACT

When a test mode signal from a control circuit is activated, an operation of a column related circuit is controlled to continuously apply a voltage stress to complementary internal data lines included in the column related circuit. Specifically, a write driver driving a data line is forcedly kept in an inactive state, a sense amplifier is connected to the internal data lines, a column select operation is prohibited and the internal data lines are forcedly, continuously driven in accordance with the write driver, or a voltage setting circuit is connected to the internal data lines and the voltage stress of the internal data lines is accelerated in accordance with the voltage setting circuit during a test. It is possible to continuously apply the voltage stress between complementary data lines of the internal data lines without the need to repeatedly carry out a data write operation, and it is possible to reduce time required for an inter-complementary data line voltage stress test.

11 Claims, 18 Drawing Sheets

F I G. 1 6
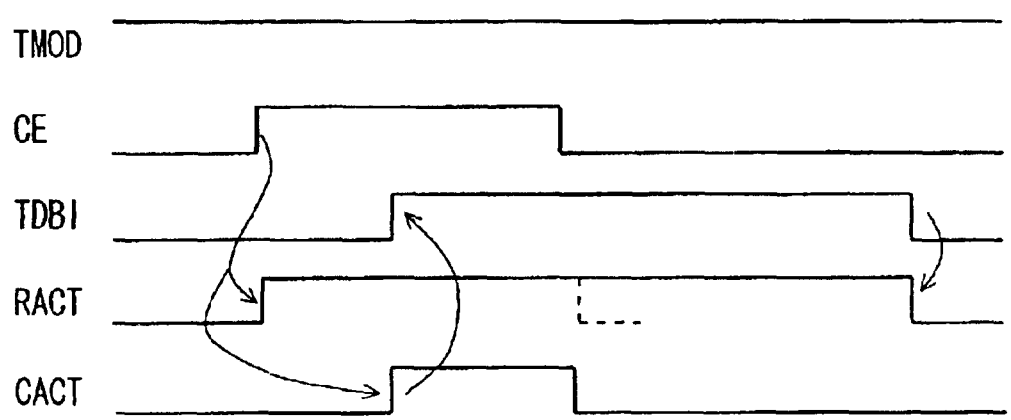

F I G. 2 0
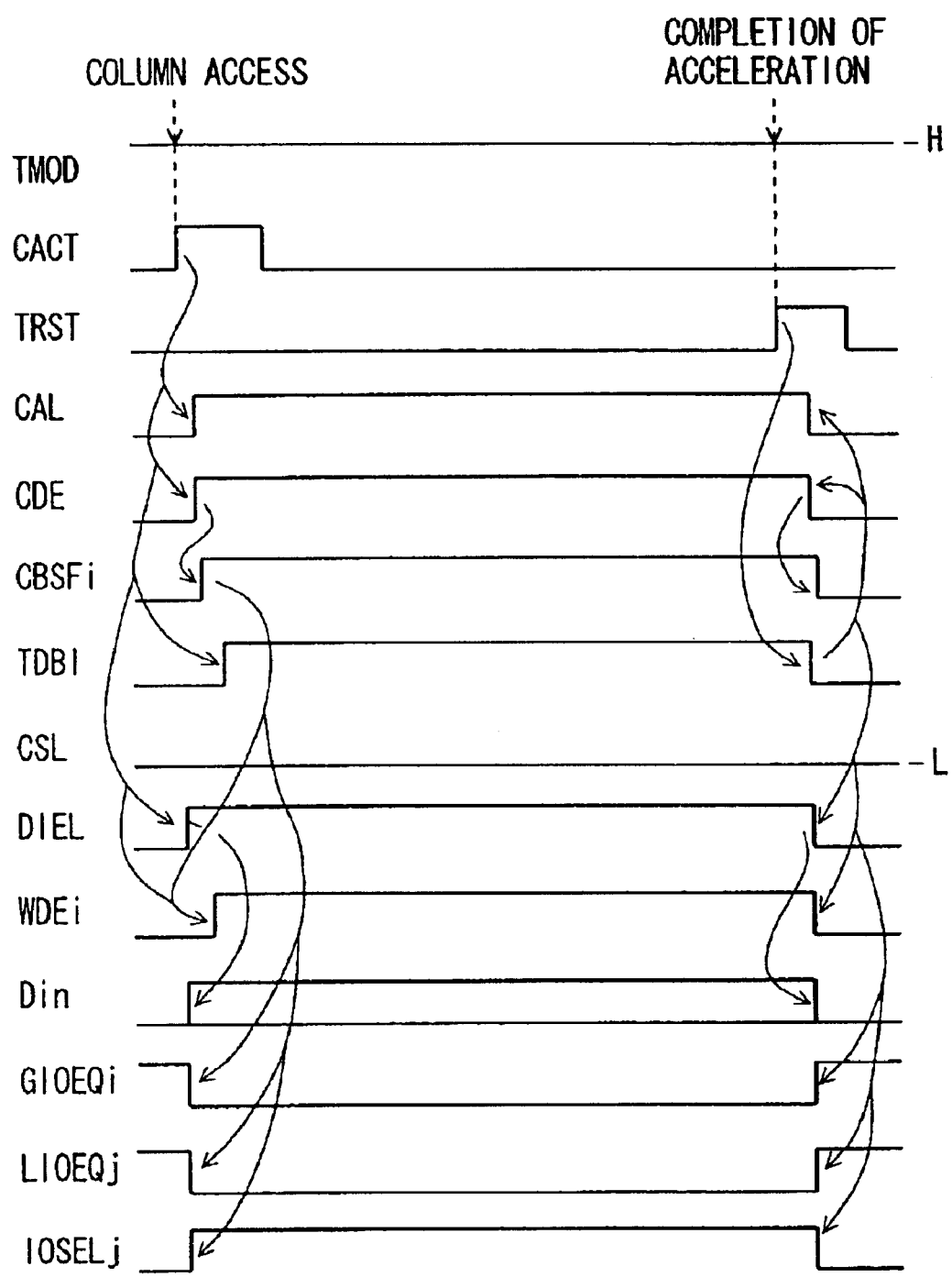

SEMICONDUCTOR MEMORY DEVICE

BACKGROUND OF THE INVENTION

1. Field of the Invention

The present invention relates to a semiconductor memory device and particularly relates to a circuit configuration for driving an internal data line. More specifically, the present invention relates to a circuit configuration for accelerating a voltage stress between complementary internal data lines.

2. Description of the Background Art

FIG. 26 is a schematic diagram showing the configurations of a main part of a conventional semiconductor memory device. In FIG. 26, a memory array MA is divided into a plurality of memory sub-blocks MSB. Memory sub-blocks MSB are arranged in alignment in row and column directions. The memory sub-blocks arranged in alignment in the row direction constitute a row block RBK. In FIG. 26, memory array MA is divided into row blocks RBK0 to RBKm along the column direction. In addition, memory sub-blocks MSB arranged in alignment in the column direction constitute a column block CBK. In FIG. 26, memory array MA is divided into column blocks CBK0 to CBKn.

Write/read circuits PW0 to PWn for writing/reading internal data are arranged corresponding to column blocks CBK0 to CBKn, respectively. These write/read circuits PW0 to PWn are connected to an input/output circuit IOK through a data bus DBS having a width of a plurality of bits.

In the semiconductor memory device shown in FIG. 26, data access is made on a column block basis. Among column blocks CBK0 to CBKn, one or a plurality, a predetermined number, of column blocks are simultaneously selected, the write/read circuit(s) arranged corresponding to the selected column block(s) is/are selectively activated and the internal data is written/read to/from the selected column block(s).

In row selection, the selection of a memory cell row is performed on a row block basis. In this row selection, as in the case of the column selection, one or a plurality of row blocks are activated among row blocks RBK0 to RBKn.

FIG. 27 is a schematic diagram showing the configurations of one memory sub-array MSB and associated internal data lines. In FIG. 27, the configuration of a section related to internal data lines transmitting 2-bit internal data is shown by way of example. The bus width of the internal data lines is desirably set.

In FIG. 27, memory sub-array MSB includes a plurality of memory cells MC arranged in a matrix of rows and columns, a plurality of bit lines BL and/BL each connecting to the memory cells in the corresponding column, and a plurality of word lines WL arranged corresponding to the memory cell rows, respectively and to each connecting to the memory cells in the corresponding row. Bit lines BL and/BL are arranged in pairs to transfer complementary data. FIG. 27 representatively shows memory cells MC arranged in two rows and two columns, word lines WLa and WLb arranged corresponding to the memory cells in the two rows, respectively, and bit line pairs BLa, ZBLa and BLb, ZBLb arranged corresponding to the memory cells in the two columns, respectively.

Memory cells MC are arranged corresponding to the crossings between one of the paired bit lines BL and ZBL and word line WL, respectively. In FIG. 27, memory cells MC are arranged corresponding to the crossing between word line WLa and bit line BLa and that between word line WLa and bit line BLb, respectively.

Memory cell MC includes a capacitor MQ which stores information, and an access transistor MT which connects a corresponding capacitor MQ to a corresponding bit line BL or ZBL in accordance with a signal on a corresponding word line WL (which generically represents a word line). Here, bit lines BL and ZBL generically represent bit lines BLa, BLb and ZBLa, ZBLb shown therein, respectively. Access transistor MT consists of an N-channel MOS (insulated gate field effect) transistor.

A sense amplifier SA is arranged corresponding to bit line pair BL and ZBL. When a sense amplifier activation signal SAE is activated, sense amplifier SA is activated to differentially amplify and latch the potentials of corresponding bit line pair BL and ZBL. Sense amplifier SA normally includes a P-sense amplifier which consists of cross-coupled P-channel MOS transistors and an N-sense amplifier which consists of cross-coupled N-channel MOS transistors. Sense amplifier activation signal SAE, therefore, includes a signal which activates the P-sense amplifier and a signal which activates the N-sense amplifier.

A column select gate CSGa which connects bit lines BLa and ZBLa to local data lines LIO0 and ZLIO0, respectively in accordance with a column select signal CSL, is arranged corresponding to bit line pair BLa and ZBLa. Likewise, a column select gate CSGb which is rendered conductive in accordance with column select signal CSL and which connects bit lines BLb and ZBLb to local data lines LIO1 and ZLIO1, respectively, when conductive, is arranged corresponding to bit line pair BLb and ZBLb.

Local data lines LIO0, ZLIO0, LIO1 and ZLIO1 are arranged for each memory sub-block in each column block. In row block selection, local data lines LIO and ZLIO (which generically represent LIO0 and LIO1, and ZLIO0 and ZLIO1, respectively) arranged for the memory sub-blocks in the selected row block are connected to corresponding global data lines described later, respectively.

An equalization transistor LQ0 responsive to a local data line equalization instruction signal LIOEQ is arranged for local data lines LIO0 and ZLIO0. Likewise, an equalization transistor LQ1 responsive to local data line equalization instruction signal LIOEQ is arranged for local data lines LIO1 and ZLIO1. When conductive, equalization transistor LQ0 electrically short-circuits local data lines LIO0 and ZLIO0. When conductive, equalization transistor LQ1 electrically short-circuits local data lines LIO1 and ZLIO1.

Local data lines LIO0, ZLIO0, and LIO1, ZLIO1 are electrically connected to global data lines GIO0, ZGIO0 and GIO1, ZGIO1 through IO select gates IOG0 and IOG1, respectively. IO select gates IOG0 and IOG1 are rendered conductive when IO select signal IOSEL to be activated for a selected row block is activated, and connect, when conductive, corresponding local data lines LIO0, ZLIO0 and LIO1, ZLIO1 to global data lines GIO0, ZGIO0 and GIO1, ZGIO1, respectively.

Global data lines GIO0, ZGIO0 and GIO1, ZGIO1 are arranged in common to the memory sub-blocks included in a column block. In the corresponding column block, one memory row block is selected with respect to global data lines GIO0, ZGIO0, GIO1 and ZGIO1, and the local data lines provided for the memory sub-blocks included in the corresponding row block are electrically connected to the corresponding global data lines.

An equalization transistor GQ0 which electrically equalizes global data lines GIO0 and ZGIO0, and a pull-up circuit PUG0 which pulls up the potentials of global data lines GIO0 and ZGIO0 in data read, are provided for global data lines GIO0 and ZGIO0. Likewise, an equalization transistor GQ1 and a pull-up circuit PUG1 are arranged for global data lines GIO1 and ZGIO1.

Equalization transistors GQ0 and GQ1 become conductive when a global data line equalization instruction signal GIOEQ is activated. When a column block select signal CBS is activated, pull-up circuits PUG0 and PUG1 are activated to pull up the potentials of global data lines GIO, ZGIO0 and GIO1, ZGIO1 to a power supply voltage level, to decrease the voltage amplitudes of global data lines GIO0, ZGIO0 and GIO1, ZGIO1 in data read, to transmit small amplitude read signals and to achieve high speed data read.

In data write, this column block select signal CBS is kept inactive for a selected column block. In accordance with write data, global data lines GIO0, ZGIO0 and GIO1, ZGIO1 are driven to a power supply voltage level and a ground voltage level, respectively.

Global data lines GIO, ZGIO0 and GIO1, ZGIO1 are driven in accordance with the write data by write drivers WRD0 and WRD1, respectively. When a write driver enable signal WDE is activated, write drivers WRD0 and WRD1 generate complementary written data in accordance with data transmitted on data buses DB0 and DB1 of data bus DBS, and drive global data lines GIO, ZGIO0 and GIO1, ZGIO1, respectively. This write driver enable signal WDE is activated only for a selected column block.

FIG. 28 is a signal waveform diagram representing the operation of the semiconductor memory device shown in FIG. 27 in data write. Referring to FIG. 28, the operation of the semiconductor memory device shown in FIG. 27 in data writing will be briefly described.

An array activation signal RACT is driven to an active state in accordance with an external row select operation instruction signal, so that this semiconductor memory device starts a row select operation. When array activation signal RACT is activated, a memory cell row select operation is performed in accordance with an address signal externally applied, word line WL arranged corresponding to an addressed row in the selected row block is driven to a selected state, and the voltage level of selected word line WL rises.

When the voltage level of selected word line WL rises, access transistors MT of memory cells MC connected to selected word line WL turns conductive and the data stored in corresponding capacitors MQ is transmitted to corresponding bit lines BL or ZBL. Bit lines BL and ZBL are kept at intermediate voltage level by a bit line equalization circuit, not shown, in a standby cycle. In accordance with the activation of array activation signal RACT, the equalization operation for bit lines BL and ZBL is stopped. The data stored in the memory cells is read to bit lines BL or ZBL and the other bit lines are kept at precharge voltage level. Accordingly, potential difference between bit lines BL and ZBL is produced in accordance with the data stored in the associated memory cell.

When the potential difference between bit lines BL and ZBL is sufficiently developed, sense amplifier activation signal SAE is activated, the voltages on bit lines BL and ZBL are differentially amplified by a corresponding sense amplifier SA, and bit lines BL and ZBL are driven to power supply voltage Vccs and the ground voltage level in accordance with the read data and the bit line voltages are latched by the associated sense amplifier.

During this row select operation, the circuitry related to the column selection and the write/read of the internal data are kept in a precharged state as in the standby cycle.

In a normal DRAM (dynamic random access memory), a row access instruction for row selection and a column access instruction for column selection and data write/read are applied in a time division multiplexed manner. In a DRAM which has an interface compatible with that of an SRAM (static random access memory), however, a row access instruction and a column access instruction are simultaneously applied by one access instruction and a row select operation and a column select operation are executed internally in a time division multiplexed manner. Therefore, in the above description of the operation of the semiconductor memory device, the row access instruction and the column access instruction may be applied simultaneously and the row select operation and the column select operation may be performed internally in a time division multiplexed manner.

When each sense amplifier completes its sensing operation, a column select operation activation signal CACT is activated in accordance with a column access instruction. When column select operation activation signal CACT is activated, IO select signal IOSEL corresponding to a selected row block turns H level in accordance with the already applied row address signal. In addition, local data line equalization instruction signal LIOEQ becomes L level. As a result, local data lines LIO and ZLIO are connected to global data lines GIO and ZGIO, respectively. Additionally, column block select signal CBS turns L level in accordance with a column block designation address signal included in the column address signal in data writing, whereby the pull-up operations by pull-up circuits PUG0 and PUG1 on global data lines GIO0, ZGIO0 and GIO1, ZGIO1 to power supply voltage Vccs level are stopped.

Then, the write driver enable signal WDE for the selected column block is activated, and write drivers WRD0 and WRD1 drive global data lines GIO0, ZGIO0 and GIO1, ZGIO1 to power supply voltage Vccs and ground voltage levels in accordance with the write data applied through data buses DB0 and DB1, respectively.

The write data applied to global data lines GIO0, ZGIO0 and GIO1, ZGIO1 are transmitted to local data lines LIO0, ZLIO0 and LIO, ZLIO1 through IO select gates IOG0 and IOG1, respectively.

Then, column select signal CSL is driven to a selected state in the form of a one-shot pulse in accordance with the column address signal, so that column select gates CSGa and CSGb are rendered conductive and the data latched by sense amplifiers SA are set at the voltage level according to the write data.

When predetermined time elapses, column related control signals IOSEL, LIOEQ, CSL, CBS, WDE and GIOEQ are each returned to an original precharged state.

In data writing, when column select operation activation signal CACT is activated while column access is made, column select signal CSL is activated only for a short period of time, such as about 4 to 5 ns, and data are written to the selected memory cells.

In data reading, a preamplifier enable signal in place of word driver enable signal WDE is activated to activate a preamplifier circuit, not shown. In data reading, column block select signal CBS is kept at H level, and pull-up circuits PUG0 and PUG1 perform their pull-up operations to decrease the signal amplitudes of the global data lines and transmit read signals at high speed.

The semiconductor memory device is subjected to a stress accelerating test referred to as "burn-in test" so as to ensure product reliability. In this stress accelerating test, the semiconductor memory device is operated under conditions of higher voltage and higher temperature than those of the practical usage conditions in an ordinary operation of the semiconductor memory device, a voltage stress and a temperature stress applied to this semiconductor memory device are accelerated and latent defects are thereby made detectable. Such a stress accelerating test is performed on various parts of the semiconductor memory device. One of the items of this stress accelerating test is a data line stress accelerating test.

In this data line stress accelerating test, the voltage stress between local data lines LIO and ZLIO is accelerated and that between global data lines GIO and ZGIO is accelerated. By accelerating the voltage stresses between these complementary data lines, latent short-circuits between the complementary data lines are made revealed. To this end, therefore, it is necessary to transmit a power supply voltage and a ground voltage to one and the other of local data lines LIO and ZLIO, respectively. Likewise, it is necessary to transmit the power supply voltage and the ground voltage to one and the other of global data lines GIO and ZGIO, respectively.

To accelerate the voltage stresses applied to these data lines, conventionally internal write data is transmitted onto global data lines GIO and ZGIO by the write driver, thereby accelerating the stresses between the complementary data lines, i.e., the stress between the global data lines and that between the local data lines.

However, if the write driver is driven while accelerating the stresses between the complementary data lines of the global data lines and the local data lines, the following disadvantage occurs. Specifically, write driver WDR (WDR0, WDR1) is merely activated in accordance with write driver enable signal WDE. Write driver enable signal WDE is activated only for a time period of, e.g., about 3 to 4 ns. Due to this, it is necessary to repeatedly perform a data write operation so as to apply sufficient stresses between the complementary data lines of the global data lines and the local data lines.

To repeatedly perform the data write operation, it is necessary to successively apply a data write instruction externally. In this case, column access instruction may be successively applied with a word line kept in a selected state in accordance with a fast access mode such as a page mode. Normally, however, if one data write instruction is applied, the next data write cannot be instructed for a period referred to generally as a "CAS precharge period". Further, when a data write instruction is applied, it is necessary to secure setup/hold time for the address signals and the control signals. As a result, data write cycle time become disadvantageously longer, the number of times of repeating the write operations increases so as to sufficiently apply voltage stresses, the stresses cannot be accelerated at high speed, and time required for accelerating the stresses between the complementary data lines becomes disadvantageously longer.

Moreover, if the voltage stresses between the complementary data lines are accelerated using this write driver, the complementary data lines repeat a voltage stress accelerated state and a precharged state alternately. As a result, it is difficult to efficiently apply the stresses between the complementary data lines and the inter-complementary-data-line stress accelerating test time becomes disadvantageously longer.

SUMMARY OF THE INVENTION

It is an object of the present invention to provide a semiconductor memory device capable of greatly shortening time required to perform an accelerating test for accelerating the stress between complementary data lines.

It is another object of the present invention to provide a semiconductor memory device capable of efficiently applying a stress between complementary data lines.

A semiconductor memory device according to a first aspect of the present invention includes: a plurality of memory cells arranged in rows and columns; a plurality of sense amplifiers arranged corresponding to the columns of the memory cells, and sensing and amplifying data of the memory cells in the corresponding columns when activated; a column select control circuit for holding a column select instruction signal in an active state in accordance with a test operation mode instruction signal, and generating the column select instruction signal in the form of a one-shot pulse in accordance with a column access instruction signal in a normal operation mode when the test operation mode instruction signal is deactivated; a column select circuit for connecting a sense amplifier arranged corresponding to a selected column to an internal data bus in response to the column select instruction signal; a write circuit for driving the internal data line in accordance with a write instruction signal; and a write control circuit for holding the write instruction signal in an inactive state when the test operation mode instruction signal is activated.

A semiconductor memory device according to a second aspect of the present invention includes: a plurality of memory cells arranged in rows and columns; an internal data bus for transmitting and receiving data to and from a selected memory cell among the plurality of memory cells; a write circuit for driving the internal data bus in response to a write instruction signal; a write control circuit for holding the write instruction signal in an active state in accordance with a test operation mode instruction signal, and activating the write instruction signal in a one-shot pulse form in response to a write operation mode instruction signal when the test operation mode instruction signal is deactivated; a plurality of sense amplifiers arranged corresponding to the columns of the memory cells, and sensing and amplifying data of the memory cells read to the corresponding columns when activated,; a column select circuit arranged corresponding to the plurality of sense amplifiers, and connecting the sense amplifier arranged corresponding to a selected column to the internal data bus in accordance with a column select signal; and a column select control circuit for holding the column select signal in an inactive state in accordance with the test operation mode instruction signal.

A semiconductor memory device according to a third aspect of the present invention includes: a plurality of memory cells arranged in rows and columns; an internal data bus for transmitting and receiving data to and from a selected memory cell among the plurality of memory cells; a voltage setting circuit selectively activated in accordance with a test operation mode instruction signal, and holding the internal data bus at a predetermined voltage level when activated; and a voltage holding circuit for holding the internal data bus at the predetermined voltage level when an access instruction signal, instructing selection of the selected memory cell, is deactivated while the test operation mode instruction signal is deactivated.

In the test operation mode, complementary data are transmitted to the internal data lines without using the write driver, it is possible to continuously apply a voltage stress between the complementary data lines, it is possible to efficiently accelerate the voltage stress, and it is thereby possible to reduce time required for a complementary data line stress accelerating test. Since the stress voltage is continuously applied to the complementary data lines, it is in particular unnecessary to repeat write operation. In addition, the application/stop of application of the voltage stress are not repeatedly carried out but the voltage stress is efficiently applied between the complementary data lines. It is thereby possible to greatly reduce stress accelerating time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a timing chart representing an operation of a circuit shown in FIG. 15;

FIG. 20 is a timing chart representing an operation of the circuitry shown in FIGS. 17 to 19;

DESCRIPTION OF THE PREFERRED EMBODIMENTS

First Embodiment

Figure 1:
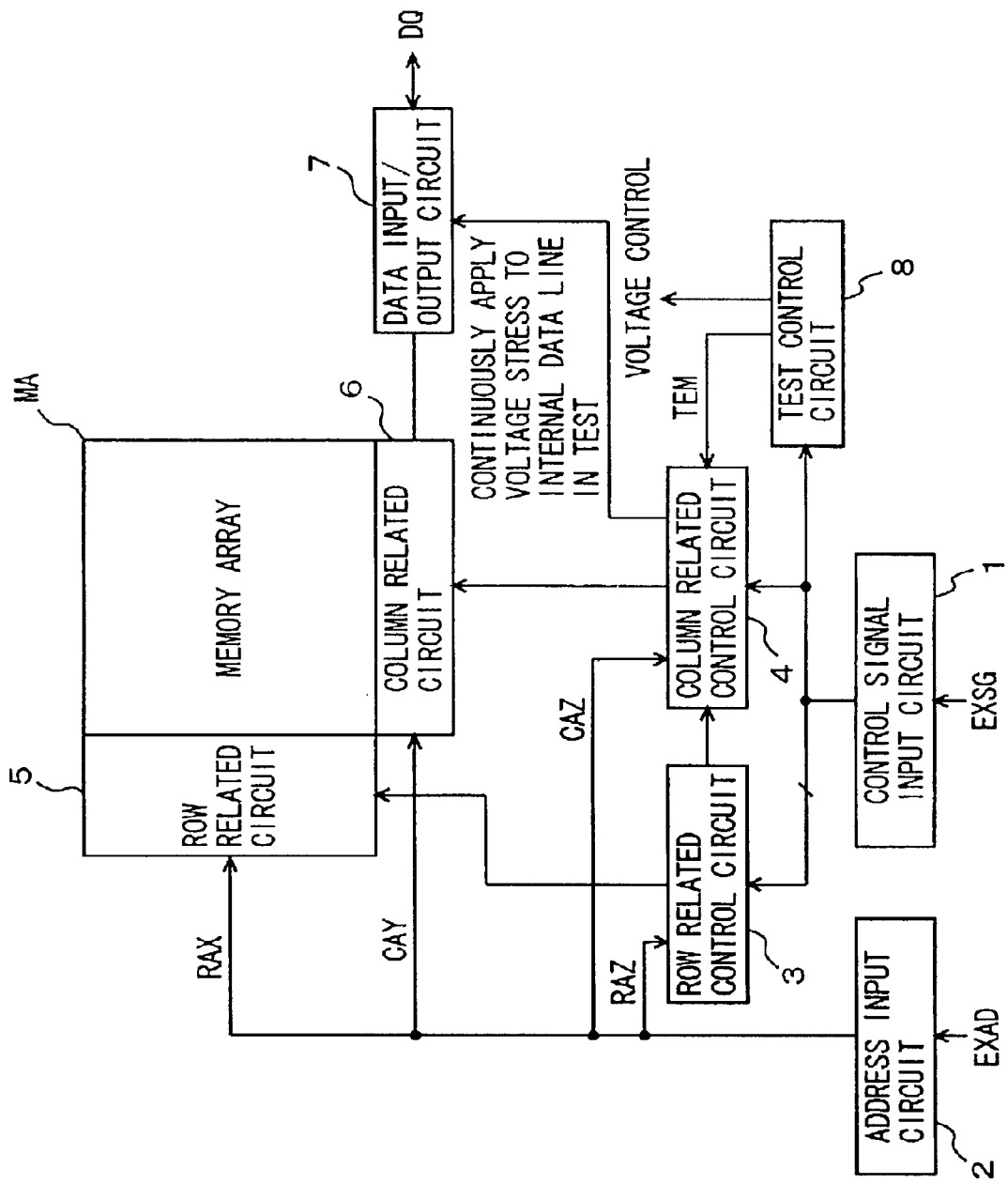
FIG. 1 is a schematic diagram showing the overall configuration of a semiconductor memory device according to a first embodiment of the present invention.

FIG. 1 is a schematic diagram showing the overall configuration of a semiconductor memory device according to the first embodiment of the present invention. In FIG. 1, the semiconductor memory device includes: a control signal input circuit 1 which buffers an external signal EXSG and generates an internal control signal; an address input circuit 2 which takes in an external address signal EXD and generates an internal address signal; a row related control circuit 3 which generates a row related control signal for controlling an operation related to the row selection of memory array MA in accordance with the internal control signal from control signal input circuit 1; a column related control circuit 4 which generates a column related control signal for controlling an operation related to the column selection of memory array MA in accordance with the internal control signal from control signal input circuit 1; a row related circuit 5 which selects an addressed row of memory array MA in accordance with the row related control signal from row related control circuit 3 and an internal row address signal RAX from address input circuit 2; a column related circuit 6 which selects a column of memory array MA in accordance with the column control signal from column control circuit 4 and an internal column address signal CAY from address input circuit 2 and writes an reads data to and from the selected column; a data input/output circuit 7 which is selectively activated in accordance with an input/output control signal included in the column related control signal from column related control circuit 4 and transmits and receives internal data to and from a write/read circuit included in column related circuit 6 when activated; and a test control circuit 8 which generates a test mode instruction signal TEM for designating an inter-line stress accelerating test of accelerating a stress between complementary data lines in accordance with the internal control signal from control signal input circuit 1 and controls a power supply voltage (not shown) during stress acceleration.

Figure 26:
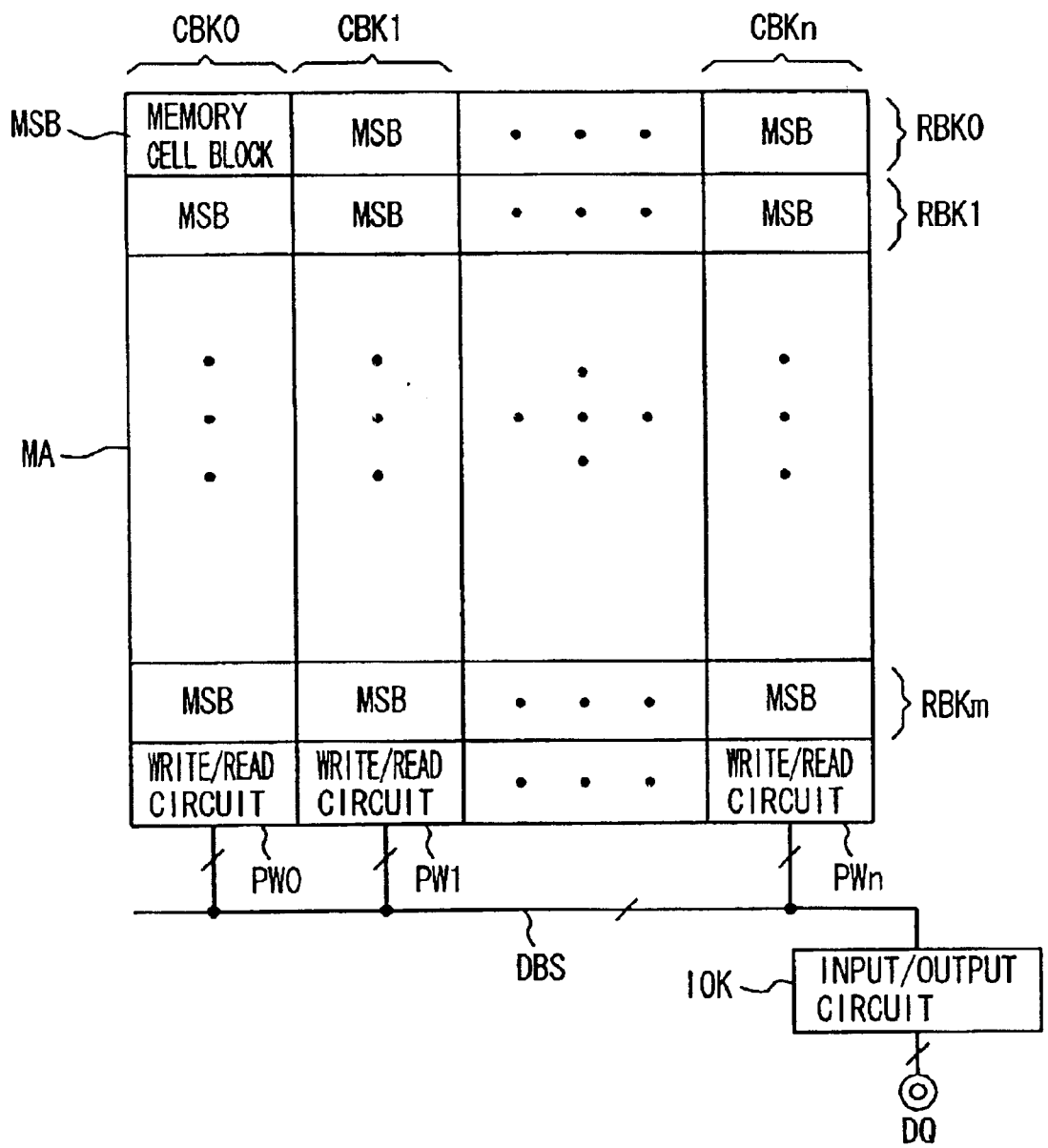
FIG. 26 is a schematic diagram showing the configuration of a main part of a conventional semiconductor memory device.

A block address signal RAZ is applied to row related control circuit 3. As already shown in FIG. 26, memory array MA is divided into row blocks and column blocks. A row block is designated in accordance with block address signal RAZ, and a row select operation is executed to the designated row block.

A column block address signal CAZ for designating a column block is applied to column related control circuit 4 from address input circuit 2. Column related control circuit 4 activates/deactivates the column related operation control signal applied to the column block designated by column block address signal CAZ.

Further, in FIG. 1, the internal control signal is applied to test control circuit 8 from control signal input circuit 1 and an inter-line stress accelerating test mode is designated to accelerate a voltage stress between complementary data lines. Alternatively, a specific internal address bit may be also applied to test control circuit 8 from address input circuit 2 and the inter-line stress accelerating test mode of accelerating a voltage stress between complementary data lines may be designated in accordance with a combination of the specific address signal bit and the internal control signal. Hereinbelow, the test mode of accelerating a voltage stress between complementary data lines such as global data lines and local data lines, is simply referred to the inter-line stress accelerating test mode.

Row related circuit 5 includes a row decoding circuit which decodes internal row address signal RAX and selects a word line, a sense amplifier circuit, and a bit line precharge/equalization circuit.

Column related circuit 6 includes a column decoding circuit which decodes internal column address signal CAY, an equalization circuits for local data lines and for global data lines, an IO select gate which connects the local data line arranged corresponding to a selected row block to the corresponding global data line, a global data line pull-up circuit which pulls up the potential of the global data line to power supply voltage level during data reading and precharging, and a write/read circuit which writes/reads internal data.

Column related control circuit 4 determines the activation period of column related circuit 6 in accordance with an external signal when test mode instruction signal TEM is activated. When the stress between complementary data lines is accelerated, a column select operation is performed and array power supply voltage (the power supply voltage of the sense amplifier) Vccs is accelerated (boosted) while the selected column is connected to the local data lines and the global data lines. The sense amplifier latches complementary data in accordance with the memory cell data read to the corresponding bit line. In accordance with the complementary data of this sense amplifier, the voltage stress between the complementary data lines, i.e., the voltage stress between the local data lines and that between the global data lines are accelerated. In this operation, the write circuit included in the column related circuit 6 is kept inactive.

Since the activation period of the column related circuit is determined by the external signal, it is possible to set the voltage stress accelerating time for the local data lines and the global data lines at an appropriate period of time and to continuously apply the voltage stress. It is, therefore, unnecessary to repeatedly perform a data writing operation and to greatly reduce a time period required for the inter-line stress accelerating test.

Figure 2:
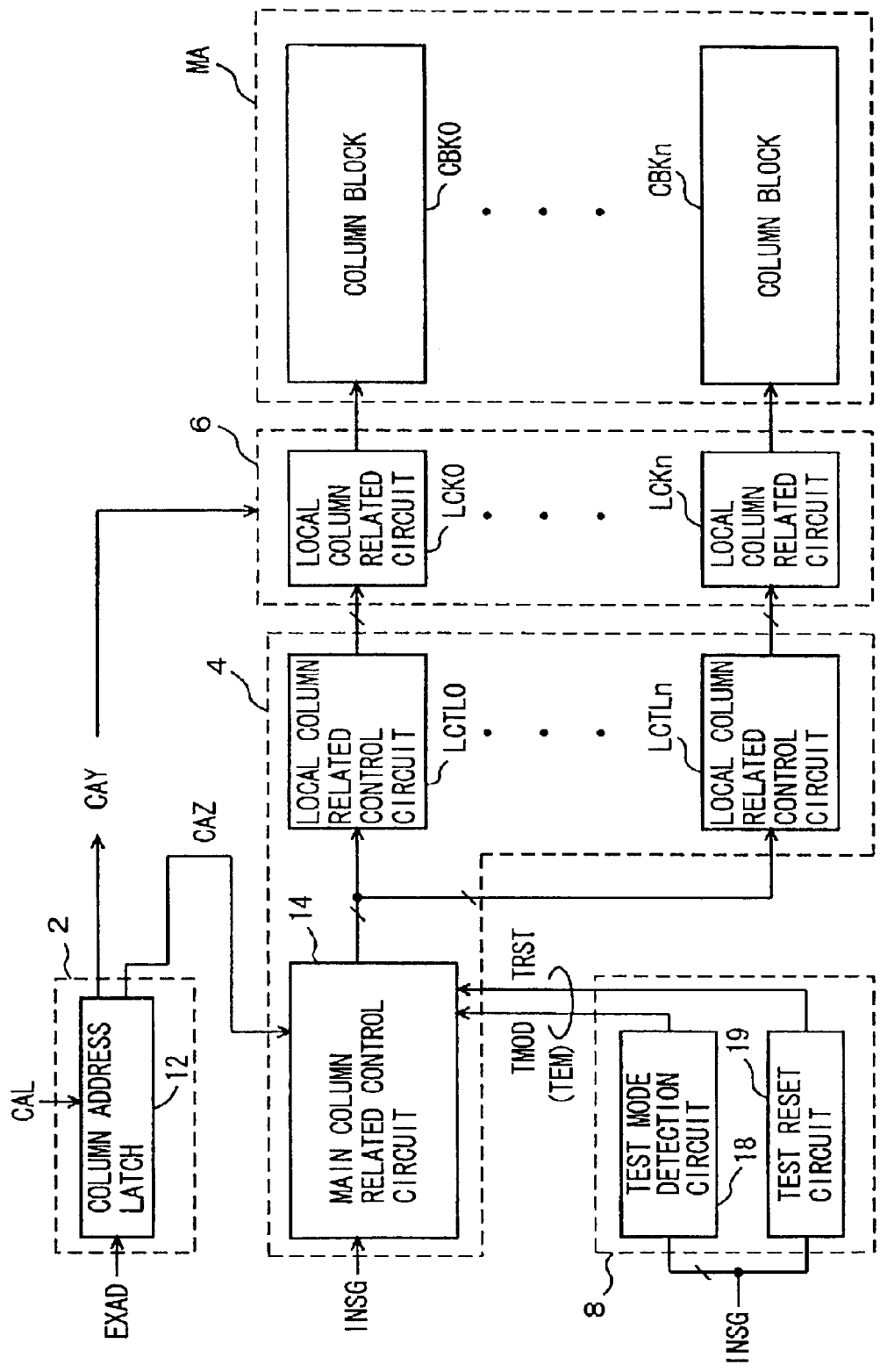
FIG. 2 is a schematic diagram showing the configurations of a main part of the semiconductor memory device according to the first embodiment of the present invention.

FIG. 2 is a schematic diagram showing section related to the column selection of the semiconductor memory device shown in FIG. 1.

In FIG. 2, memory array MA is divided into a plurality of column blocks CBK0 to CBKn. In a normal operation mode, a row select operation is performed to column blocks CBK0 to CBKn in common and a column select operation is executed on a column block basis. Alternatively, these column blocks CBK0 to CBKn may constitute memory mats, respectively, a row select circuit and a column select circuit may be arranged to the respective memory mats and a row select operation may be performed individually in each memory mat. In this case, the selection of the memory mat is performed in accordance with a column address and data transfer is performed between the selected memory mat and the global data lines. In the following description, a configuration is discussed in which row selection is performed every row block RBK as in the case of the configuration shown in FIG. 26 and in which data access is made to memory sub-blocks included in the selected column block of the selected row block. Accordingly, a local data line pair is arranged corresponding to each memory sub-block.

Figure 27:
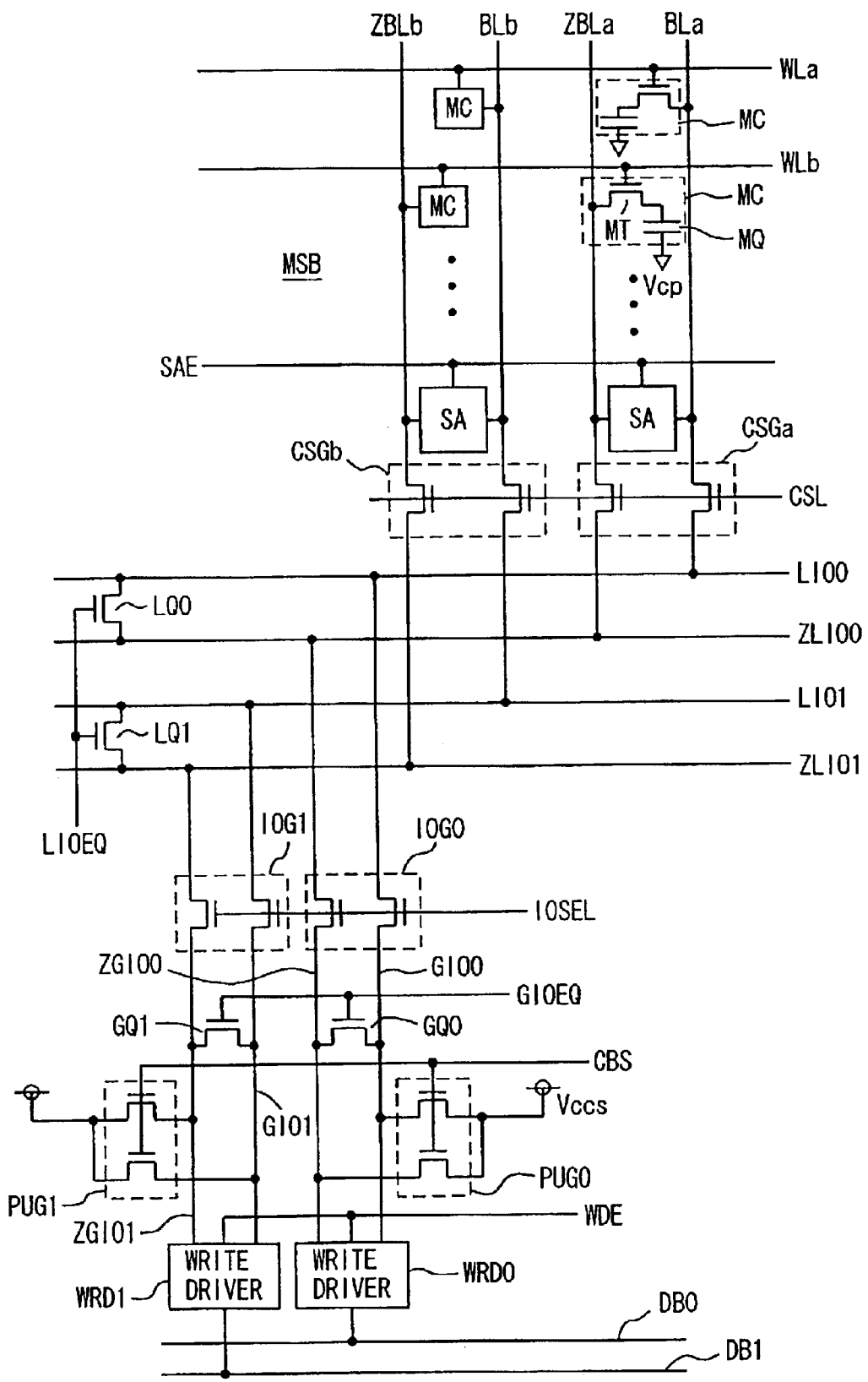
FIG. 27 is a diagram showing the configurations of internal data line related sections of the conventional semiconductor memory device.
Figure 28:
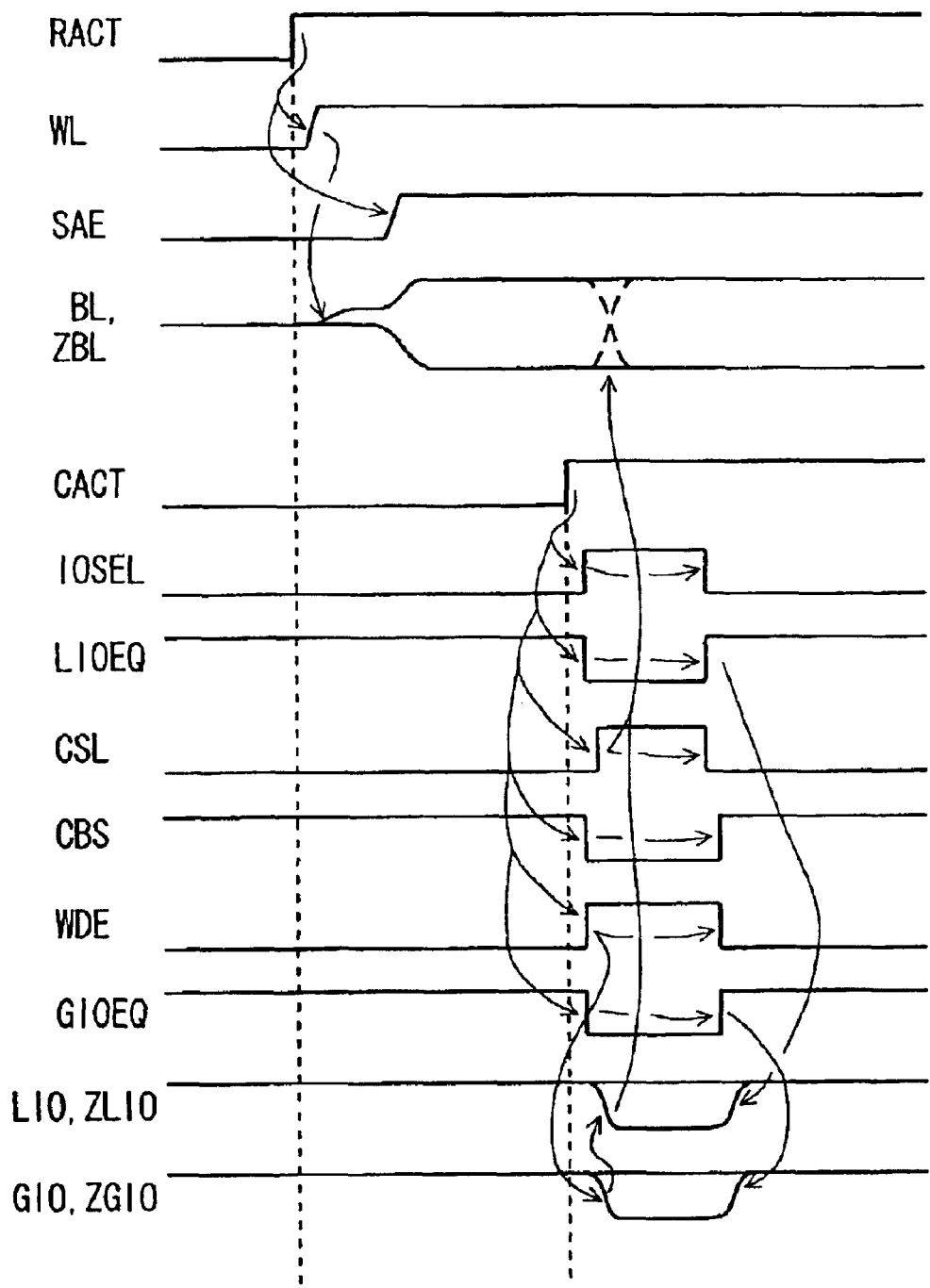
FIG. 28 is a timing chart representing an operation of the circuitry shown in FIG. 27.

Column related circuit 6 includes local column related circuits LCK0 to LCKn arranged corresponding to column blocks CBK0 to CBKn, respectively. Each of local column related circuits LCK0 to LCKn includes the column select gate, the local data line equalization transistor, the global data line equalization transistor, the global data line pull-up circuit, the write driver and the preamplifier as shown in FIG. 27.

Column related control circuit 4 includes a main column related control circuit 14 provided in common to local column related circuits LCK0 to LCKn, and local column related control circuits LCTL0 to LCTLn arranged corresponding to local column related circuits LCK0 to LCKn, for controlling the operations of the corresponding local column related circuits in accordance with a main column related control signal and a column block designation signal from main column related control circuit 14, respectively.

Main column related circuit 14 generates a main column related control signal when a column access instruction is applied in accordance with an internal signal INSG including a column block address signal and applied from control signal input circuit 1 shown in FIG. 1. The man column related control signal and the column block designation signal are applied to the local column related control circuits. The local column control circuit arranged corresponding to the column block designated by the column block designation signal generates a local column related control signal and applies the generated signal to the corresponding column block.

The semiconductor memory device to which a row access instruction instructing a row selection operation and a column access instruction instructing a column selection operation are externally applied in a time division multiplexed manner will be described as a representative of the semiconductor memory device hereinafter. The present invention is applicable to a DRAM having an interface compatible with an SRAM interface to which the row access instruction and the column access instruction are simultaneously applied.

Address input circuit 2 includes a column address latch 12 which generates internal column address signal CAY and internal column block address signal CAZ in accordance with column address latch instruction signal CAL from main column related control circuit 14. In a normal operation mode, column address latch instruction signal CAL is kept in an active state for a predetermined period. In an inter-line stress accelerating test, the activation period of column address latch instruction signal CAL is set by an external signal.

Test control circuit 8 includes a test mode detection circuit 18 which detects that the inter-line stress accelerating test is designated in accordance with internal signal INSG from control signal input circuit 1 shown in FIG. 1, and a test reset circuit 19 which detects that the completion of the voltage accelerating test including the inter-line stress acceleration test is designated in accordance with internal signal INSG.

Internal signal INSG is an internal signal of a plurality of bits. When the plurality of bits are set in a predetermined state, the test mode detection circuit 18 holds a test mode signal TMOD in an active state. Alternatively, a specific address bit may be also applied to test mode detection circuit 18. This predetermined state may be a state of the timing relation of the plurality of bits of the internal signal or a state of a combination of the logic levels thereof. Further, the predetermined state may be a state of voltage level such as a super Vcc condition, or may be a combination of these conditions. When this test mode signal TMOD is activated, the voltage stress between the complementary data lines can be accelerated.

Test reset circuit 19 generates a test reset signal TRST for finishing the inter-line stress accelerating test in accordance with one or a plurality of signals included in internal signal INSG. Main column related control circuit 14 sets a column select operation into an active state in accordance with a specific signal when test mode signal TMOD is activated. When test reset signal TRST is activated, the column selecting operation is completed.

Test mode signal TMOD and test reset signal TRST correspond to test mode instruction signal TEM shown in FIG. 1.

Figure 3:
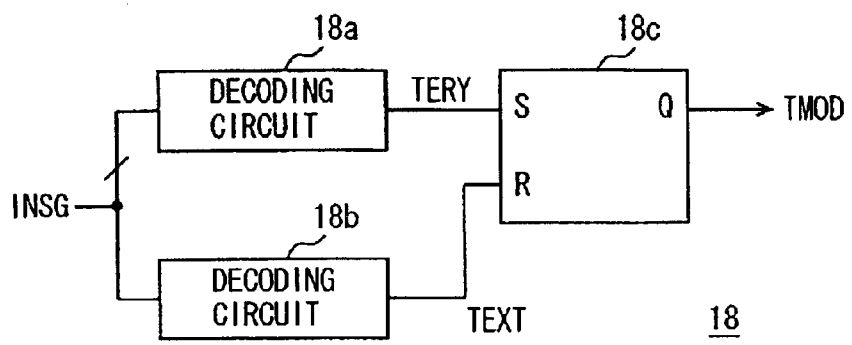
FIG. 3 is a schematic diagram showing the configuration of a test mode detection circuit shown in FIG. 2.
Figure 4:
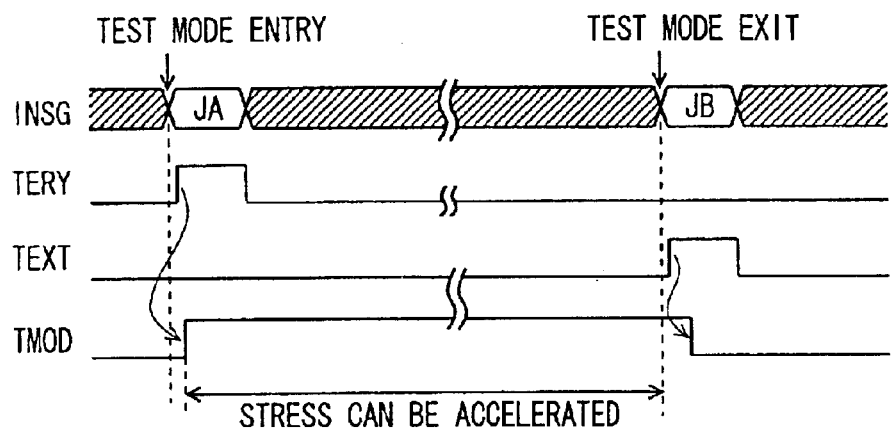
FIG. 4 is a timing chart representing an operation of the circuit shown in FIG. 3.

FIG. 3 is a schematic diagram showing an example of the configuration of test mode detection circuit 18 shown in FIG. 2. In FIG. 3, test mode detection circuit 18 includes a decoding circuit 18a which activates a test mode entry signal TERY when internal signal INSG of a plurality of bits is in a predetermined combination of states, a decoding circuit 18b which activates a test mode exit signal TEXT when internal signal INSG is in another predetermined combination of states, and a set/reset flip-flop 18c which is set in response to the activation of test mode entry signal TERY from decoding signal 18a and which is reset in accordance with a test mode exit signal TEXT from decoding circuit 18b. Test mode signal TMOD is outputted from an output Q of set/reset flip-flop 18c. Now, the operation of test mode detection circuit 18 shown in FIG. 3 will be described with reference to the timing chart shown in FIG. 4.

In a test mode entry, internal signal INSG of a plurality of bits is set into a state JA of, for example, a predetermined combination of logic levels. In accordance with the state JA, decoding circuit 18a activates test mode entry signal TERY and set/reset flip-flop 18c is set, accordingly. As a result, test mode signal TMOD is activated. While test mode signal TMOD is activated, a stress accelerating test can be performed. When voltage stresses are actually accelerated, a further operation mode instruction signal is used.

Figure 5:
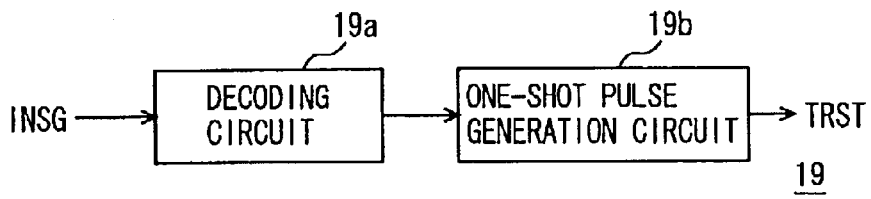
FIG. 5 is a schematic diagram showing an example of the configuration of a test reset detection circuit shown in FIG. 2.

FIG. 5 is a schematic diagram showing an example of the configuration of test rest detection circuit 19 shown in FIG. 2. In FIG. 5, test reset detection circuit 19 includes a decoding circuit 19a which generates an activation signal when internal signal INSG is in a predetermined state of, for example, logic levels of the plurality of bits, and a one-shot pulse generation circuit 19b which generates test reset signal TRST in accordance with the activation signal of decoding circuit 19a. This one-shot pulse generation circuit 19b is provided to adjust the timing and other(s) of test reset signal TRST so as to apply test reset signal TRST to main column related control circuit 14 shown in FIG. 2.

Figure 6:
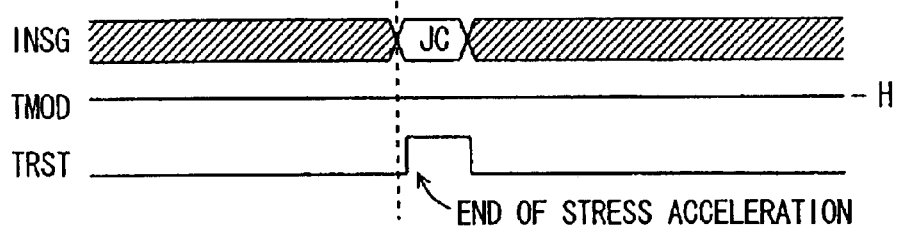
FIG. 6 is a timing chart representing an operation of the circuit shown in FIG. 5.

In test reset detection circuit 19 shown in FIG. 5, when internal signal INSG is set in a predetermined state JC as shown in the timing chart of FIG. 6, one-shot pulse generation circuit 19b drives test reset signal TRST to an H-level, active state for a predetermined period of time T. When test reset signal TRST is activated, the column selection operation performed internally is stopped, the sense amplifier is disconnected from the local data lines and global data lines and the acceleration of the voltage stress between the complementary data lines, i.e., the voltage stress between the local data lines and that between the global data lines is stopped.

When this test reset signal TRST is generated (activated), test mode signal TMOD has been already set at H level. Therefore, one-shot pulse generation circuit 19b may be so constituted as to generate test reset signal TRST when test mode signal TMOD is at H level and the internal signal satisfies a predetermined condition.

Further, internal signal INSG used for the setting/finishing of the test mode may be control signals of a plurality of bits, a combination of control signals of a plurality of bits and a specific address signal, or one control signal. Further, to set/reset the test mode, a super Vcc condition of a specific signal set at a higher voltage level than a normal power supply voltage level may be additionally used in combination.

Figure 7:
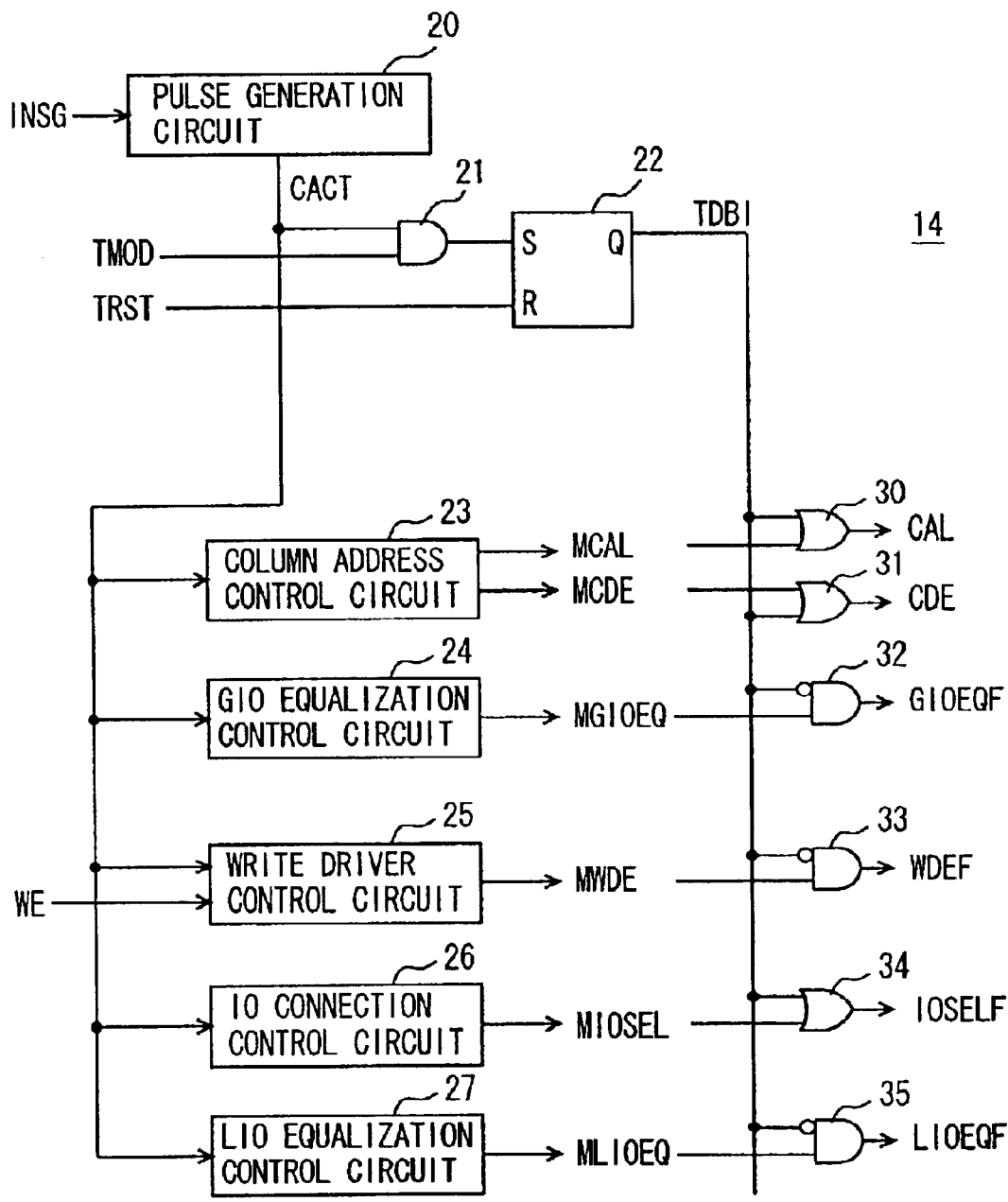
FIG. 7 is a schematic diagram showing an example of the configuration of a main column related control circuit shown in FIG. 2.

FIG. 7 is a schematic diagram showing an example of the configuration of main column related control circuit 14 shown in FIG. 2. In FIG. 7, main column related control circuit 14 includes: a pulse generation circuit 20 which generates column select operation activation signal CACT having a predetermined time width when internal signal INSG instructs a column access; an AND circuit 21 which receives column select operation activation signal CACT from pulse generation circuit 20 and test mode signal TMOD; a set/reset flip-flop 22 which is set in response to the activation (H level) of the output signal of AND circuit 21 and is reset in accordance with test rest signal TRST; a column address control circuit 23 which generates a main column address latch instruction signal MCAL and a main column address decoding activation signal MCDE each having a predetermined time width in accordance with column select operation activation signal CACT; a GIO equalization control circuit 24 which generates a main global data line equalization instruction signal MGIOEQ in accordance with the activation of column select operation activation signal CACT; a write driver control circuit 25 which generates a main word driver enable signal MWDE in accordance with a write enable signal WE instructing data writing and generated through a not shown path and column select operation activation signal CACT; an IO connection control circuit 26 which generates a main IO line select signal MIOSEL in accordance with column select operation activation signal CACT; and an LIO equalization control circuit 27 which generates a main local data line equalization instruction signal MLIOEQ in response to the activation of column select operation activation signal CACT.

A voltage stress activation signal TDBI which determines a time period of applying the voltage stress between the complementary data lines is outputted from an output Q of set/reset flip-flop 22.

In main column related control circuit 14, control circuits 23 to 27 generate corresponding main column related control signals, respectively. Alternatively, control circuits 27 to 27 may be so constituted as to activate/deactivate the corresponding main column related control signals according to a predetermined sequence sequentially, triggered by activation of column access activation signal CACT. In the latter case, the activation/deactivation of a column select trigger signal which serves as a trigger is controlled in accordance with voltage stress activation signal TDBI.

Main column related control circuit 14 further includes: an OR circuit 30 which generates column address latch instruction signal CAL in response to voltage stress activation signal TDBI from set/reset flip-flop 22 and main column address latch instruction signal MCAL; an OR circuit 31 which generates a column address decoding enable signal CDE in response to main column address decoding enable signal MCDE and voltage stress activation signal TDBI; a gate circuit 32 which generates a global data line equalization fast signal GIOEQF in response to main global data line equalization instruction signal MGIOEQ and voltage stress activation signal TDBI; a gate circuit 33 which generates a write driver enable fast signal WDEF in response to main word driver enable signal MWDE and voltage stress activation signal TDBI; an OR circuit 34 which generates an IO line select fast signal IOSELF in response to main IO line select signal MIOSEL and voltage stress activation signal TDBI; and a gate circuit 35 which generates a local data line equalization fast signal LIOEQF in response to main local data line equalization instruction signal MLIOEQ and voltage stress activation signal TDBI.

When voltage stress activation signal TDBI is in an active state (at H level), gate circuits 32, 33 and 35 hold global data line equalization fast signal GIOEQF, write driver enable fast signal WDEF and local data line equalization fast signal LIOEQF in an L-level, inactive state, respectively. When voltage stress activation signal TDBI is in an active state (at H level), OR circuits 30, 31 and 34 hold corresponding column address latch signal CAL, column address decoding enable signal CDE and IO line select fast signal IOSELF at H level, respectively. Therefore, while voltage stress activation signal TDBI is active, the column selection operation is maintained and the selected column is connected to the local data lines and the global data lines.

Figure 8:
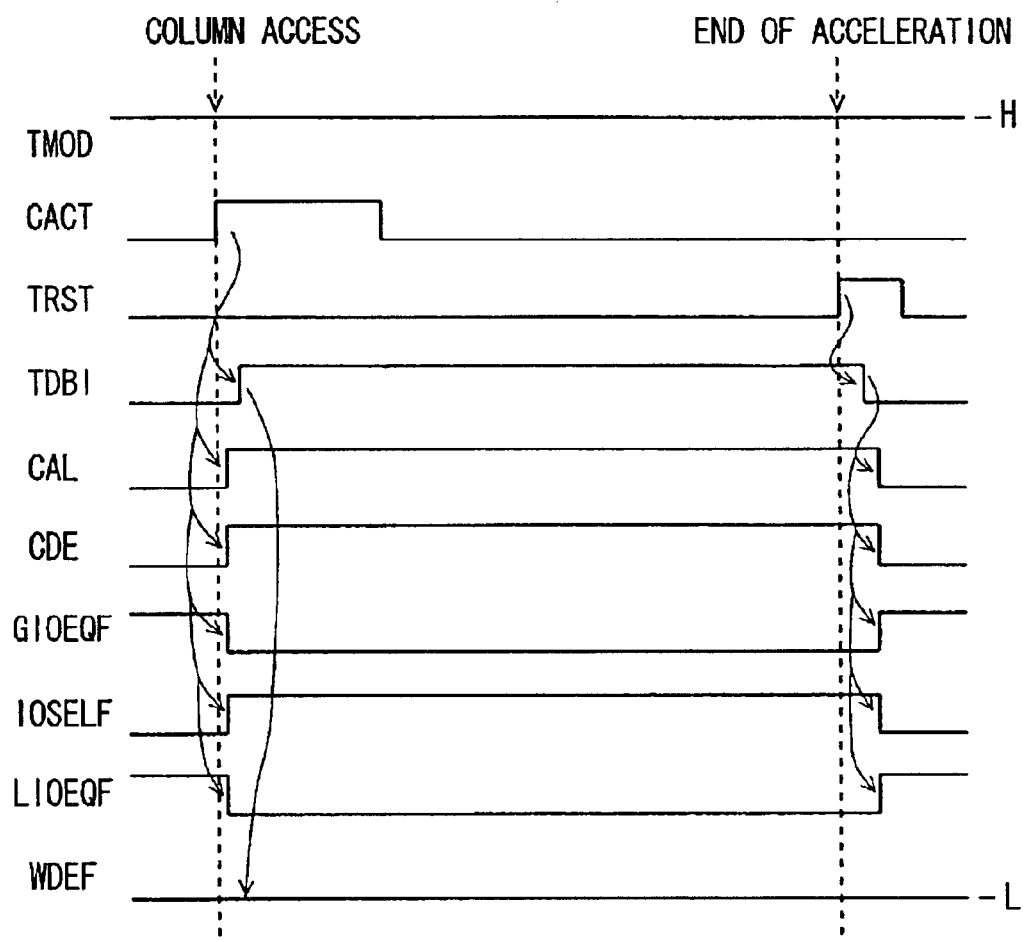
FIG. 8 is a timing chart representing an operation of the circuit shown in FIG. 7.

FIG. 8 is a timing chart representing the operation of main column related control circuit 14 shown in FIG. 7. Referring to FIG. 8, the operation of main column related control circuit 14 shown in FIG. 7 will be briefly described.

When the voltage stress between the complementary data lines is accelerated, test mode signal TMOD is set at H level. In this state, a column address signal and a column access instruction are applied to main column related control circuit 14 externally. In accordance with this column access instruction, column selection operation activation signal CACT is driven to an H-level, active state for a predetermined period of time. In accordance with the activation of column selection operation activation signal CACT, control circuits 23 to 27 shown in FIG. 7 activate/deactivate the corresponding column related control signals at predetermined timings, respectively. In addition, in accordance with the activation of column select activation signal CACT, set/reset flip-flop 22 is set and voltage stress activation signal TDBI is responsively activated.

In accordance with the activation of voltage stress activation signal TDBI, column address latch instruction signal CAL, column address decoding enable signal CDE and IO line select fast signal IOSELF from OR circuits 30, 31 and 34 are kept at H level, respectively, and global data line equalization fast signal GIOEQF, write driver enable fast signal WDEF and local data line equalization fast signal LIOEQF from gate circuits 32, 33 and 35 are kept at L level, respectively.

Therefore, a column selection operation is performed in accordance with a column address when this column address instruction is applied, and the data latched by the sense amplifier which has been already activated by the row select operation is transmitted to the local data lines and the global data lines. This column selection operation is performed, triggered by the activation of column select operation activation signal CACT.

Even if main column related control signals MCAL, MCBE and MWDE outputted from control circuits 23 to 27 are deactivated in response to deactivation of column select activation signal CACT and main global equalization instruction signal MGIOEQ, main IO line select signal MIOSEL and main local data line equalization instruction signal MLIOEQ are driven to an inactive state, the column selecting state is still maintained internally since voltage stress activation signal TDBI is in an H-level, active state.

In this state, a sense power supply voltage applied to the sense amplifier is boosted. The complementary data are latched by the sense amplifier, and the voltage level of the H-level data out of the complementary data is determined by the sense amplifier power supply voltage. Since the sense amplifier drives the local data line pair and the global data line pair, the voltage levels of the H-level data among the complementary data transmitted to these data line pairs are raised and the voltage stress between the complementary data lines is thereby accelerated.

When a voltage stress acceleration end instruction is externally applied from so as to finish this voltage stress acceleration, test reset signal TRST from test control circuit 8 is activated, set/reset flip-flop 22 is reset and voltage stress activation signal TDBI is deactivated (driven to L level). The output signals of control circuits 23 to 27 have been already deactivated in accordance with the deactivation of column select operation activation signal CACT which is activated for a predetermined period of time. Therefore, when voltage stress activation signal TDBI is deactivated, column address latch instruction signal CAL, column address decoding enable signal CDE and IO line select fast signal IOSELF are driven to L level and global data line equalization fast signal GIOEQF and local data line equalization fast signal LIOEQF are driven to H level. Since main write driver enable signal MWDE is in an inactive state, write driver enable fast signal WDEF is kept in an inactive state. As a result, the column related circuits are each returned to a precharged state and the acceleration of the voltage stress between the global data lines and that between the local data lines by the sense amplifier is finished.

According to the configuration of main column related control circuit 14 shown in FIG. 7, control circuits 23 to 27 individually activate/deactivate the corresponding main column related control signals in accordance with the activation of column select activation signal CACT. Alternatively, in a configuration in which control circuits 23 to 27 are constituted like a sequence controller to activate and deactivate the main column related control signals in a predetermined sequence in accordance with activation and deactivation of the column select activation signal CACT, the ORed signal of voltage stress activation signal TDBI and column select activation signal CACT is applied to these control circuits 23 to 27. Even with such configuration, it is possible to similarly set the column selecting time period at desired time period in accordance with an external control signal.

Figure 9:
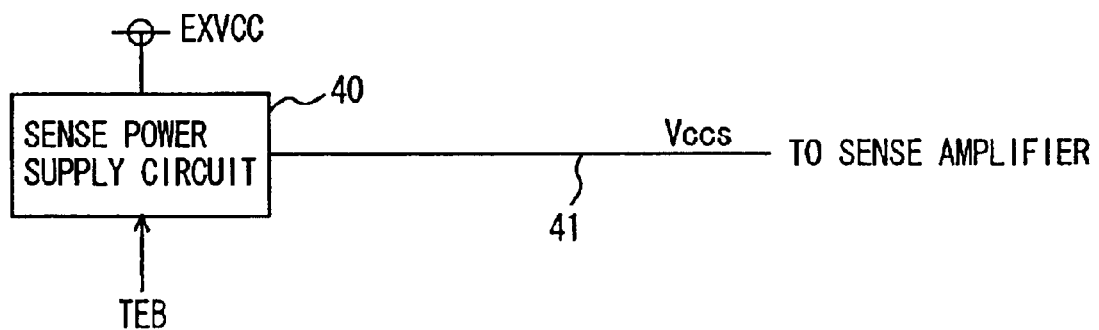
FIG. 9 is a schematic diagram showing an example of the configuration of a sense power supply control section according to the first embodiment of the present invention.

FIG. 9 is a schematic diagram showing the configuration of a sense power supply system. In FIG. 9, sense power supply voltage Vccs is transmitted from a sense power supply circuit 40 to the sense amplifier through a sense power supply line 41. Sense power supply circuit 40 generates sense power supply voltage Vccs from an external power supply voltage EXVCC through a voltage down converting operation, for example. When voltage stress acceleration instruction signal TEB is applied from test control circuit 8, sense power supply circuit 40 transmits external power supply voltage EXVCC to sense power supply line 41.

Sense power supply circuit 40 is formed of, for example, an internal voltage down converting circuit. In a normal operation mode, sense power supply circuit 40 down-converts external power supply voltage EXVCC and generates sense power supply voltage Vccs of predetermined voltage level. When voltage stress acceleration instruction signal TEB is activated, sense power supply circuit 40 stops its internal voltage down-converting operation and transmits external power supply voltage EXVCC onto sense power supply line 41. As a result, it is possible to apply voltage stresses to the local data lines and the global data lines from sense power supply line 41 through the sense amplifier and the column select gate in accordance with external power supply voltage EXVCC. During this voltage stress acceleration, it is also possible to accelerate the voltage stress of the bit lines and accelerate the voltage stress of the sense power supply line, in addition to the acceleration of the voltage stress between the complementary data lines, i.e., the voltage stress between the local data lines and that between the global data lines.

Voltage stress acceleration instruction signal TEB may be generated in accordance with test mode signal TMOD or in accordance with voltage stress activation signal TDBI from set/reset flip-flop 22 shown in FIG. 7. It is also possible to use voltage stress activation signal TDBI as voltage stress acceleration signal TEB.

Figure 10:
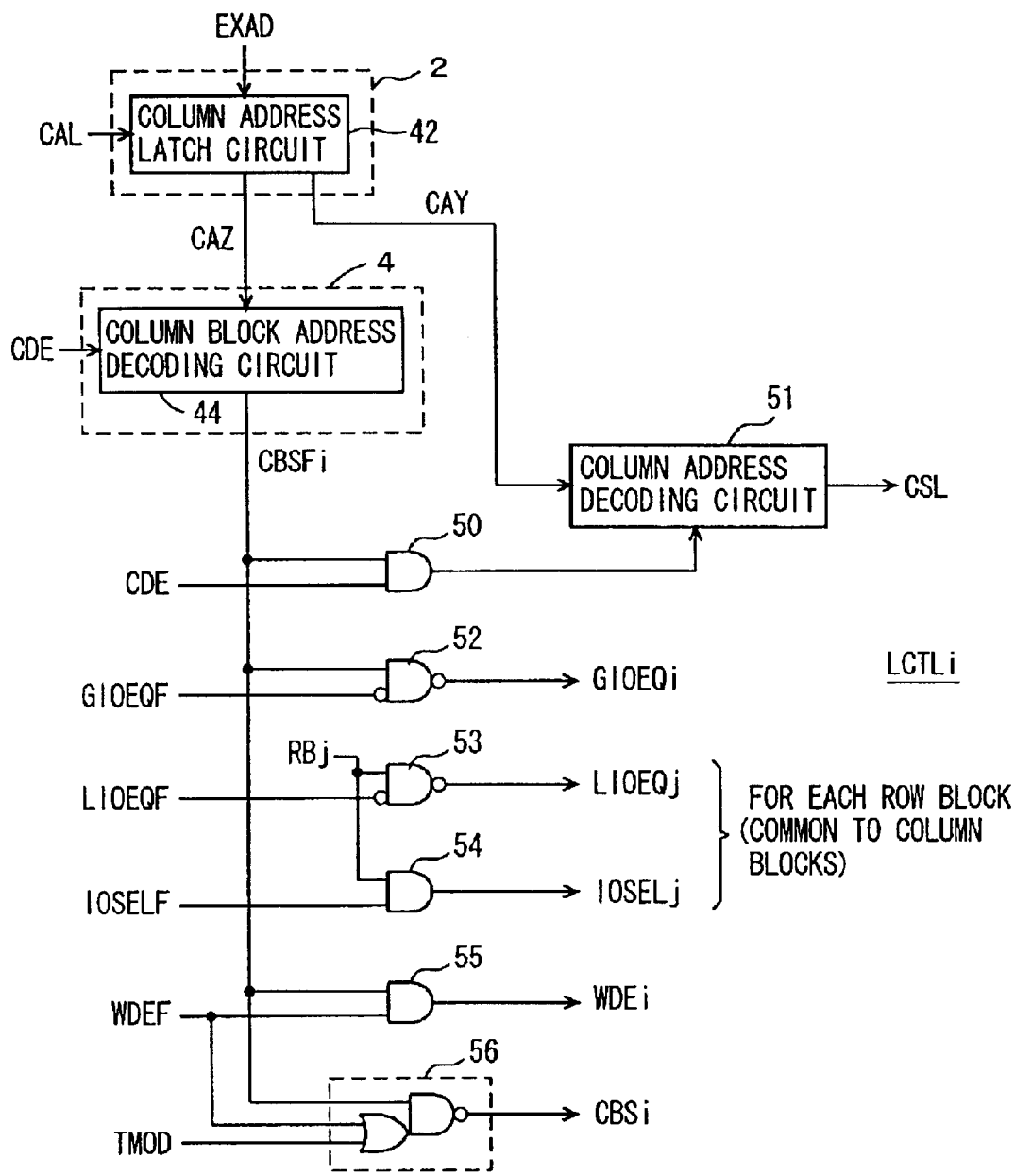
FIG. 10 is a diagram showing an example of the configuration of a local column related control circuit shown in FIG. 2.

FIG. 10 is a diagram showing an example of the configuration of local column related control circuits LCTL0 to LCTLn. Since local column related control circuits LCTL0 to LCTLn are the same in configuration, one local column related control circuit LCTLi is representatively shown in FIG. 10.

A column block indication fast signal CBSFi from a column block address decoding circuit 44 included in main column related control circuit 4 is applied to local column related control circuit LCTLi. This column block address decoding circuit 44 decodes column block address signal CAZ from a column address latch circuit 42 included in address input circuit 2 and generates column block indication fast signal CBSFi when column address decoding enable signal CDE is activated.

Column address latch circuit 42 latches an external address EXAD in accordance with column address latch instruction signal CAL from OR circuit 30 (see FIG. 7) included in this main column related control circuit 14, and generates internal column address signal CAY and internal column block address CAZ. While column address latch instruction signal CAL is at H level, column address latch circuit 42 is kept in a latching state. When a voltage stress accelerating test is performed, therefore, it is possible to keep column address latch circuit 42 in a latching state during a voltage stress acceleration operation and it is thereby possible to accurately connect the sense amplifier of the selected column to the global data lines through the corresponding local data lines during the voltage stress acceleration.

Local column related control circuit LCTLi includes: an AND circuit 50 which receives column block indication fast signal CBSFi from column block address decoding circuit 44 and column address decoding enable signal CBE; a column address decoding circuit 51 which is activated when the output signal of AND circuit 50 is activated, to decode internal column address signal CAY from column address latch circuit 42 and generates column select signal CSL; a gate circuit 52 which outputs global data line equalization instruction signal GIOEQi in response to global data line equalization fast signal GIOEQF from main column control circuit 14 and column block indication fast signal CBSFi; a gate circuit 53 which outputs local data line equalization instruction signal LIOEQj in response to row block select signal RBj from the row related control circuit and local data line equalization fast signal LIOEQF from the main column related control circuit; an AND circuit 54 which outputs IO line select signal IOSELj in response to row block select signal RBj and IO line select instruction signal IOSEL from the main column related control circuit; an AND circuit 55 which outputs write driver enable signal WDEi in response to column block indication fast signal CBSFi, write driver enable fast signal WDEF from the main column related control circuit and column block indication fast signal CBSFi; and a composite gate 56 which outputs a precharging column block select signal CBSi in response to column block indication fast signal CBSFi, write driver enable fast signal WDEF and test mode signal TMOD.

Gate circuit 52 holds global data line equalization signal GIOEQi at L level when global data line equalization fast signal GIOEQF is at L level and column block indication fast signal CBSFi is at H level.

Gate circuit 53 drives local data line equalization instruction signal LIOEQi to L level when row block select signal RBj is at H level and local data line equalization instruction fast signal LIOEQ is at L level.

Composite gate 56 equivalently includes an OR gate which receives write driver enable fast signal WDEF and test mode signal, and a NAND gate which receives the output signal of this OR gate and column block indication fast signal CBSFi for generating precharging column block select signal CBSi. When test mode signal TMOD is at H level, precharging column block select signal CBSi is generated in accordance with column block indication fast signal CBSFi.

When test mode signal TMOD is at L level, precharging column block select signal CBSi is generated in accordance with write driver enable fast signal WDEF and column block indication fast signal CBSFi.

In the configuration of local column related control circuit LCTLi shown in FIG. 10, gate circuit 53 and AND circuit 54 are arranged corresponding to each row block. Since column block select signal CBSFi is not applied to both gate circuit 53 and AND circuit 54, the local data lines arranged corresponding to the memory sub-blocks included in a selected row block are connected to the corresponding global data lines, respectively. The local data lines are arranged for each column block.

Accordingly, the connection between the local data lines and the global data lines is controlled in common to the memory sub-blocks included in the selected row block.

Alternatively, the connection between the local data lines and the global data lines may be controlled on a column block basis. In this case of the alternative, column block indication fast signal CBSi is further applied to gate circuit 53 and AND circuit 54.

Figure 11:
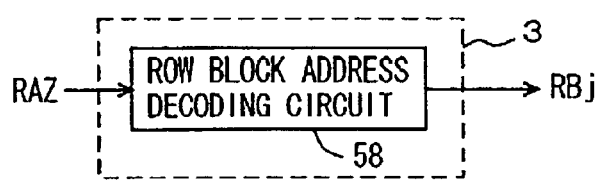
FIG. 11 is a schematic diagram showing the configurations of a main part of the row related control circuit shown in FIG. 2.

FIG. 11 is a schematic diagram showing a circuit section which generate row block select signal RBj. In FIG. 11, row block select signal RBj is generated by a row block address decoding circuit 58 included in row related control circuit 3. Row block address decoding circuit 58 decodes row block address signal RAZ applied from address input circuit 2 shown in FIG. 1 and generates row block select signal RBj.

If the sense amplifier is arranged in a shared sense amplifier configuration and the sense amplifier is shared by adjacent two row blocks, an ORed signal of row block select signals for designating the row blocks sharing this sense amplifier is applied to gate circuit 53 and AND circuit 54.

Figure 12:
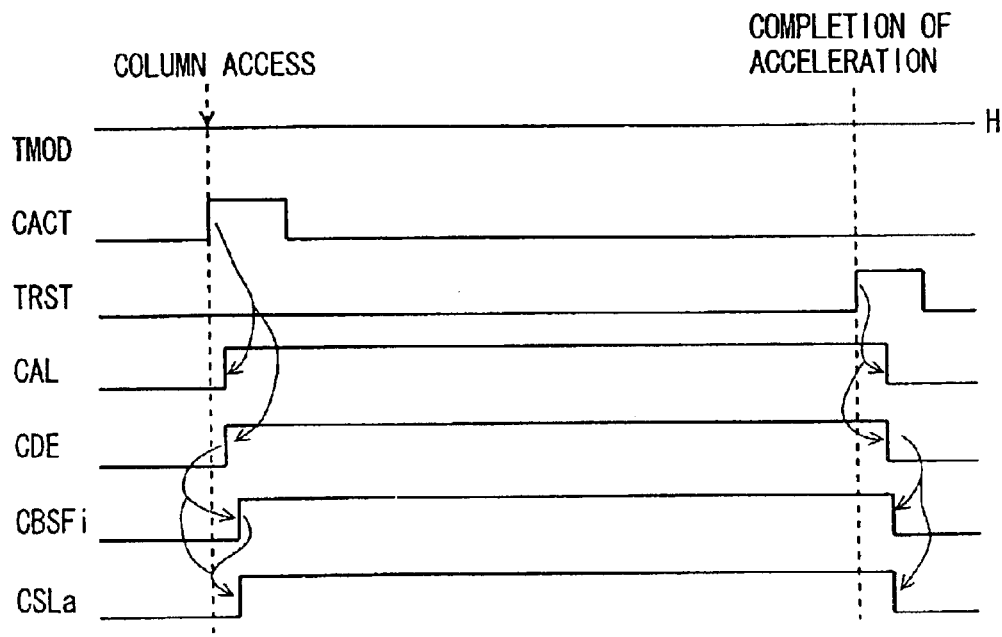
FIG. 12 is a timing chart representing an operation of the circuit shown in FIG. 10.

FIG. 12 is a timing chart representing the operation of local column related control circuit LCTLi shown in FIG. 10. Referring to FIG. 12, the operation of local column related control circuit LCTLi shown in FIG. 10 will be described.

In a column selection operation, test mode signal TMOD is set at H level. In addition, a row selection operation is completed and row block select signal RBj is driven to and kept in a selected state for the selected row block by row block address decoding circuit 58 shown in FIG. 11. Further, the sensing operation of the sense amplifier is completed, and data are latched by the sense amplifiers.

When a column access of a column selection operation starts, column selection activation signal CACT is activated for a predetermined period. In accordance with the activation of column select activation signal CACT, column address latch instruction signal CAL and column address decoding enable signal CDE are driven to an active state and the output signals of column address latch circuit 42 and column block address decoding circuit 44 shown in FIG. 10 are made definite.

When column block indication fast signal CBSFi from column block address decoding circuit 44 is driven to an active state, the local column related control signal for local column related control circuit LCTLi is set in a different state from the state in a precharge cycle. Specifically, global data line equalization instruction signal GIOEQi from gate circuit 52 and local data line equalization instruction signal LIOEQj from gate circuit 53 are set at L level and IO line select signal IOSELj from AND circuit 54 is set at L level.

During the voltage stress accelerating test, write driver enable fast signal WDEF is at L level. Therefore, write driver enable signal WDEi is kept in an L-level, inactive state. In addition, since test mode TMOD is at H level, precharging column block select signal CBSi is set at L level.

Column address decoding circuit 51 is activated in accordance with the output signal of AND circuit 50, to decode column address signal CAY, and column select signal CSL (CSLa) corresponding to an addressed column is driven to a selected state. In this test mode, even if a predetermined period of time passes since the column access starts, this state is kept until test reset signal TRST is activated next.

When test reset signal TRST is activated, the completion of the voltage stress acceleration is instructed, the column select operation is completed, column address decoding enable signal CDE and column address latch instruction signal CAL turns L level and column block indication fast signal CBSFi from column block address decoding circuit 44 turns L level, accordingly. As a result, column select signal CSL (CSLa) in a selected state is driven to an unselected state and the global data lines and the local data lines are equalized, respectively.

Further, even if row block select signal RBj is kept at H level (the completion of a row access is designated by another precharge command), IO line select fast signal IOSELF turns L level and IO select signal IOSELj also turns L level, so that the local data lines are disconnected from the respective global data lines.

Figure 13:
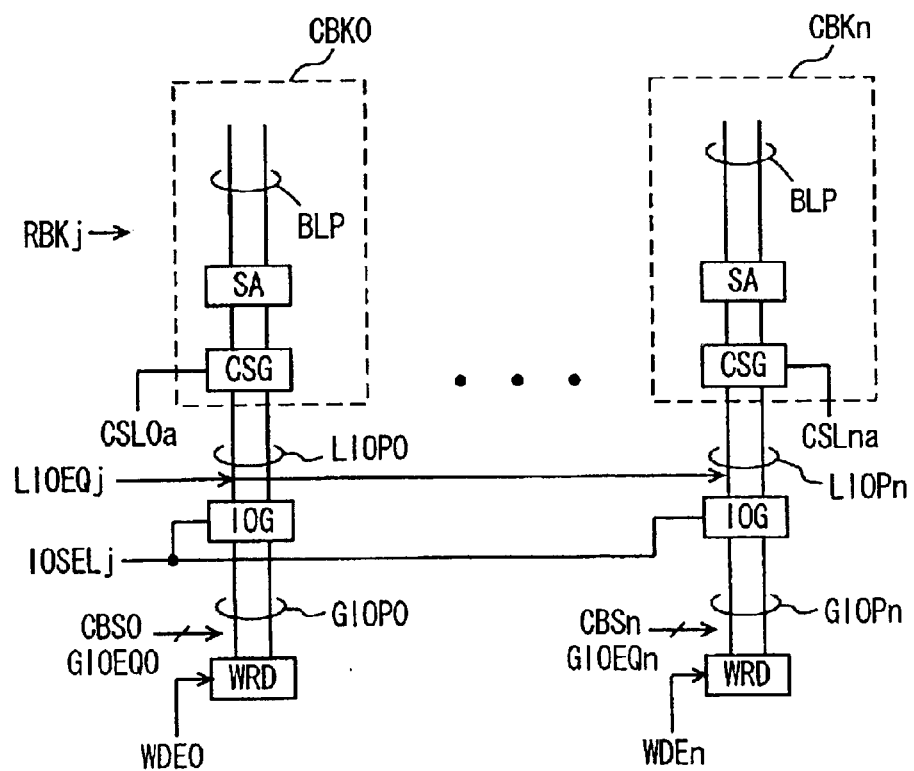
FIG. 13 is a schematic diagram showing the configuration of internal data line related sections according to the first embodiment of the present invention.

FIG. 13 is a schematic diagram showing the connection between the column block and the global data lines in one row block RBKj. In FIG. 13, one bit line pair BLP, and sense amplifier SA and column select gate CSG arranged corresponding to the one bit line pair BLP for each of column blocks CBK0 to CBKn are representatively shown.

In column block CBK0, sense amplifier SA is connected to local data line pair LIOP0 through column select gate CSG. Local data line pair LIOP0 are connected to global data line pair GIOP0 through IO select gate IOG. Write driver WRD is arranged for global data line pair GIOP0 and selectively activated in response to write driver enable signal WDE0.

In column block CBK1, sense amplifier SA is connected to local data line pair LIOPn through column select gate CSG. Local data line pair LIOPn is connected to global data line pair GIOPn through IO select gate IOG. Write driver WRD is arranged for global data line pair GIOPn and receives write driver enable signal WDEn.

IO select signal IOSELj is applied to IO select gates IOG in common. Column select signal CSL0a is applied to column select gate CSG of column select block CBK0 and column select signal CSLna is applied to column select gate CSG of column select block CBKn.

In a column selection operation, a column select signal is selected in one of column blocks CBK0 to CBKn. If column block CBK0 is designated, for example, column select signal CSL0a is driven to a selected state in accordance with an address signal and sense amplifier SA is connected to local data line pair LIOP0 and global data line pair GIOP0. In column block CBKn, a column select operation is in an inactive state by column block select signal CBSi, column select signal CSLna is kept unselected and local data line pair LIOPn are disconnected from sense amplifier SA.

Common local data line equalization instruction signal LIOEQj is applied to local data line equalization transistors respectively provided for local data line pairs LIOP0 to LIOPn. Global data line equalization instruction signal GIOEQ0 and column block select signal CBS0 are applied to the global data line equalization transistor and the pull-up circuit, not shown, for global data line pair GIOP0. Column block select signal CBSn and global data line equalization instruction signal GIOEQn are applied to the global data line equalization transistor and the pull-up circuit for global data line pair GIOPn. Therefore, in the selected column block, local data line pair LIP and global data line pair GIOP are set in voltage level according to the latched data of corresponding sense amplifier SA. In an unselected column block, column select gate CSG is nonconductive and local data line pair LIOP and corresponding global line pair GIOP are simply connected together. No problem, therefore, is caused.

If pull-up circuit PUG arranged corresponding to the global data line pair receives the same sense power supply voltage Vccs as that of the sense amplifier, the pull-up voltage level of the global data line pair is boosted in accordance with the acceleration of the sense amplifier power supply voltage. In this case, during voltage stress acceleration, column block select signals CBS0 to CBSn may be forced at L level in accordance with test mode signal TMOD, and all the pull-up operations for global data line pairs GIOP0 to GIOPn may be stopped irrespective of whether corresponding column blocks are selected or unselected.

Alternatively, the sense amplifier power supply and the pull-up circuit power supply may be provided separately from each other and only the acceleration of the sense power supply voltage may be performed during this test. For example, while accelerating the voltage stress between complementary data lines, the supply of the power supply voltage to the global data line pull-up circuit is cut off.

Further, local data line equalization instruction signal LIOEQ and IO line select signal IOSELj may be set into selected/unselected state in accordance with column block indication fast signal CBSFi on a column block basis. In this case, for example, column block indication fast signal CBSFi is further applied from column block address decoding circuit 44 to gate circuit 53 and AND circuit 54 shown in FIG. 10. It is possible to control the connection between the local data lines and the global data line pairs and the equalization thereof on a column block basis.

In addition, voltage stress activation signal TDBI, instead of test mode signal TMOD, may be applied to composite gate 56.

Furthermore, this voltage stress accelerating test may be performed in a test read mode and write enable signal WE shown in FIG. 7 may be kept at L level in this test operation mode. In this case, it is particularly unnecessary to provide gate circuit 33 shown in FIG. 7. Composite gate 56 shown in FIG. 10 deactivates pull-up circuit PUG only in the selected column block in accordance with column block indication fast signal CBSi.

During the voltage stress accelerating test, if write enable signal WE is kept at H level, write driver enable signal WDEi may be kept at L level in accordance with test mode signal TMOD. In this case, composite gate 56 is constituted of a NAND circuit which receives write driver enable fast signal WDEF and column block indication fast signal CBSFi.

First Modification

Figure 14:
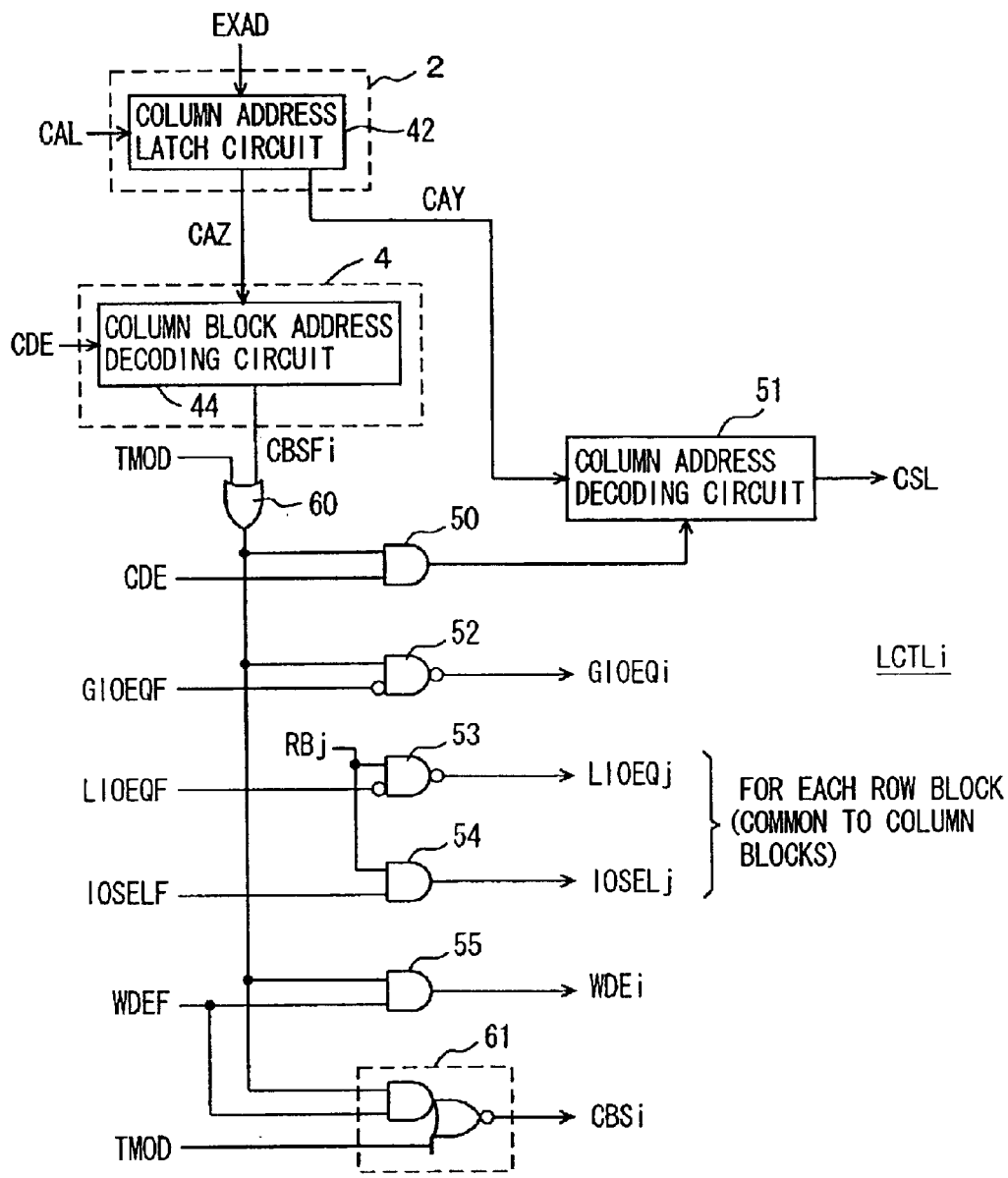
FIG. 14 is a block diagram of the first modification of the first embodiment of the present invention.

FIG. 14 is a schematic diagram showing the configuration of the first modification of the first embodiment of the present invention. In FIG. 14, an OR circuit 60 which receives column block indication fast signal CBSFi outputted from column block address decoding circuit 44 and test mode signal TMOD, is provided. The output signal of OR circuit 60 is applied to each of gate circuits 50 and 52 to 55, instead of column block indication fast signal CBSFi.

In addition, a composite gate 61 which receives test mode signal TMOD, write driver enable fast signal WDEF and the output signal of OR circuit 60, is provided. Column block select signal CBSi is generated by composite gate 61. Composite gate 61 equivalently includes an AND gate which receives write driver enable fast signal WDEF and the output signal of OR circuit 60, and a NOR gate which receives the output signal of that AND gate and test mode instruction signal TMOD and outputs column block select signal CBSi. Therefore, if test mode instruction signal TMOD is at H level, column block select signal CBSi is forced at L level.

The remaining constitution of local control circuit LCTLi shown in FIG. 14 is the same as that shown in FIG. 11. Corresponding components are denoted by the same reference numerals as those shown in FIG. 11, respectively, and will not be described herein in detail.

In the configuration shown in FIG. 14, when test mode signal TMOD turns H level, the output signal of OR circuit 60 is set at H level. Therefore, a column select operation is simultaneously performed on all of column blocks CBK0 to CBKn and the sense amplifiers are connected to the corresponding local data lines and global data lines, respectively. In addition, column block select signal CBSi outputted from composite gate 61 is at L level and the global data line pull-up operation is stopped in all the column blocks. It is, therefore, possible to simultaneously accelerate the voltage stress between the complementary data lines in all the column blocks and to further reduce the test time.

Alternatively, composite gate 61 may be configured to receive voltage stress activation signal TDBI, rather than test mode signal TMOD.

Second Modification

Figure 15:
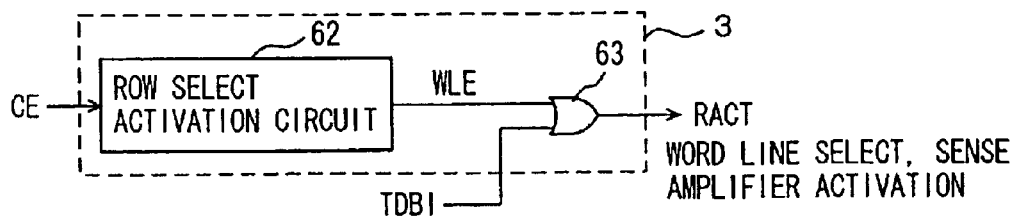
FIG. 15 is a schematic diagram showing the configuration of the second modification of the first embodiment of the present invention.

FIG. 15 is a schematic diagram showing the configuration of the second modification of the first embodiment of the present invention. In FIG. 15, row related control circuit 3 includes a row select activation circuit 62 which generates word line enable signal WLE that is activated for a given period of time in response to the activation of a chip enable signal CE, and an OR circuit 63 which receives a word line enable signal WLE from row select activation circuit 62 and a voltage stress activation signal TDBI. Array activation signal RACT is outputted from OR circuit 63. In accordance with the activation of array activation signal RACT, bit line equalization is stopped, a word line is selected and the sense amplifier is activated according to a predetermined sequence.

In the configuration shown in FIG. 15, an access instruction is made according to chip enable signal CE. Therefore, in accordance with the activation of chip enable signal CE, a row access instruction and a column access instruction are simultaneously applied. As shown in FIG. 16, in accordance with the activation of chip enable signal CE, array activation signal RACT is activated and then column select activation signal CACT is activated. When column select activation signal CACT is activated, voltage stress activation signal TDBI is activated. Voltage stress activation signal TDBI is kept in an active state until an external reset signal is applied. Accordingly, if the voltage stress between the complementary data lines is accelerated using the sense amplifier, it is possible to ensurely keep the sense amplifier in an active state for a desired period of time.

In a normal operation mode, array activation signal RACT is driven to an inactive state when a predetermined time elapses since chip enable signal CE is driven to an activated state.

Therefore, even in such an SRAM alternative memory having an interface compatible with that of an SRAM, the voltage stress between complementary data lines can be accelerated using the latch data of the sense amplifier.

In the above description, one sense amplifier is selected according to the column select signal and connected to the corresponding local data lines in a column block. Alternatively, such a configuration may be employed that in the test of accelerating the voltage stress between the complementary data lines, the same data is written to the memory cells on a row in a column block in advance, and all the sense amplifiers are selected in column selection to be connected to the corresponding local data lines at the same time. In this case, since the local data lines and the global data lines are driven by a plurality of sense amplifiers, it is possible to set the local data lines and the global data lines at predetermined voltage level and to accelerate voltages surely at high speed.

Moreover, the semiconductor memory device may be constituted so that data having different logic levels are written between odd and even column addresses, the driving of the local/global data lines by the sense amplifiers in the odd columns and the driving of the local/global data lines by the sense amplifiers in the even columns are alternately performed. By forcing the lowest one bit of the column address signal at a predetermined logic level in accordance with the test mode instruction signal, it is possible to selectively designate an even column and an odd column.

As stated so far, according to the first embodiment of the present invention, the voltage stress between the complementary data lines is accelerated using the latch data of the sense amplifier. Therefore, it is unnecessary to repeatedly execute a data writing operation, it is possible to continuously apply voltage stress between the complementary lines and it is possible to greatly reduce time required for the inter-line stress accelerating test of accelerating the voltage stress between the complementary data lines.

Second Embodiment

Figure 17:
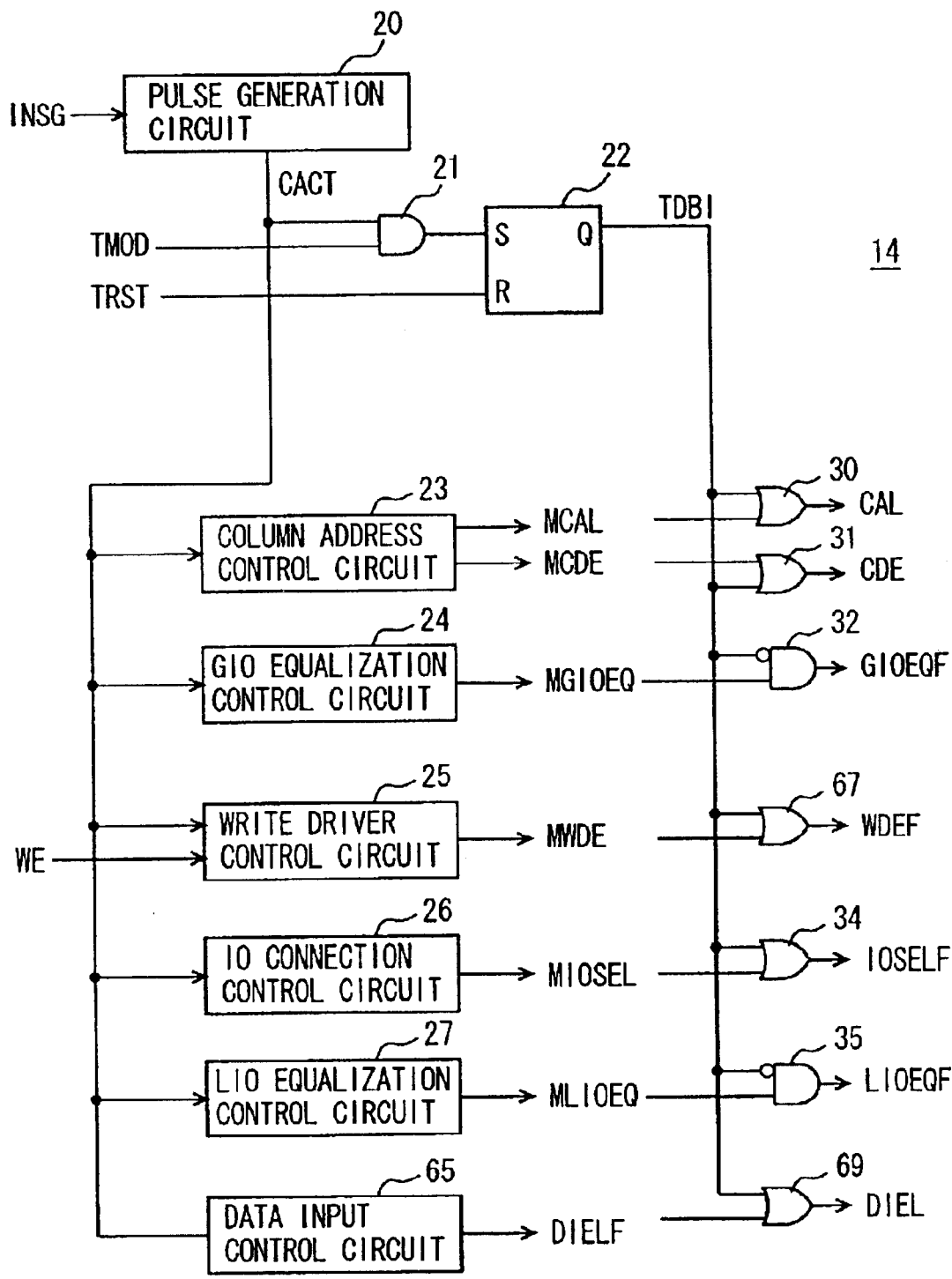
FIG. 17 is a schematic diagram showing an example of the configuration of a main column related control circuit according to a second embodiment of the present invention.

FIG. 17 is a schematic diagram showing the configuration of a main column related control circuit 14 in a semiconductor memory device according to the second embodiment of the present invention. The configuration of main column related control circuit 14 shown in FIG. 17 differs from that of main column related control circuit 14 shown in FIG. 7 in the following points.

Specifically, an OR circuit 67 which receives voltage stress acceleration signal TDBI from set/reset flip-flop 22 and main write driver enable signal MWBE is provided, in place of gate circuit 33 which receives main write driver enable signal MWDE from write driver control circuit 25. In addition, a data input control circuit 65 which outputs a data input enable/latch fast signal DIEFL for a predetermined period in accordance with the activation of column select activation signal CACT, and an OR circuit 69 which receives data input enable/latch fast signal DIELF and voltage stress activation signal TDBI and outputs a data input enable/latch signal DIEL, are provided.

The remaining construction of main column related control circuit 14 shown in FIG. 17 is the same as that of main column related control circuit 14 shown in FIG. 7. Corresponding components are denoted by the same reference numerals, and will not be described herein in detail.

In the configuration of main column related control circuit 14 shown in FIG. 17, while voltage stress activation signal TDBI is activated, write driver enable signal WDEF is kept in an active state. In addition, data input enable/latch signal DIEL is kept in an active state. As will be described later in detail, each sense amplifier is disconnected from the local data lines.

As a result, while voltage stress activation signal TDBI is activated, the global data lines and the local data lines are driven in accordance with the write driver. By accelerating the operating power supply voltage of this write driver, the voltage stresses between the complementary local data lines and that between the complementary global data lines are accelerated. In this case, the write driver generates internal write data in accordance with external data. Thus, it is also possible to continuously apply voltage stresses between the complementary global data lines and between the complementary local data lines.

Figure 18:
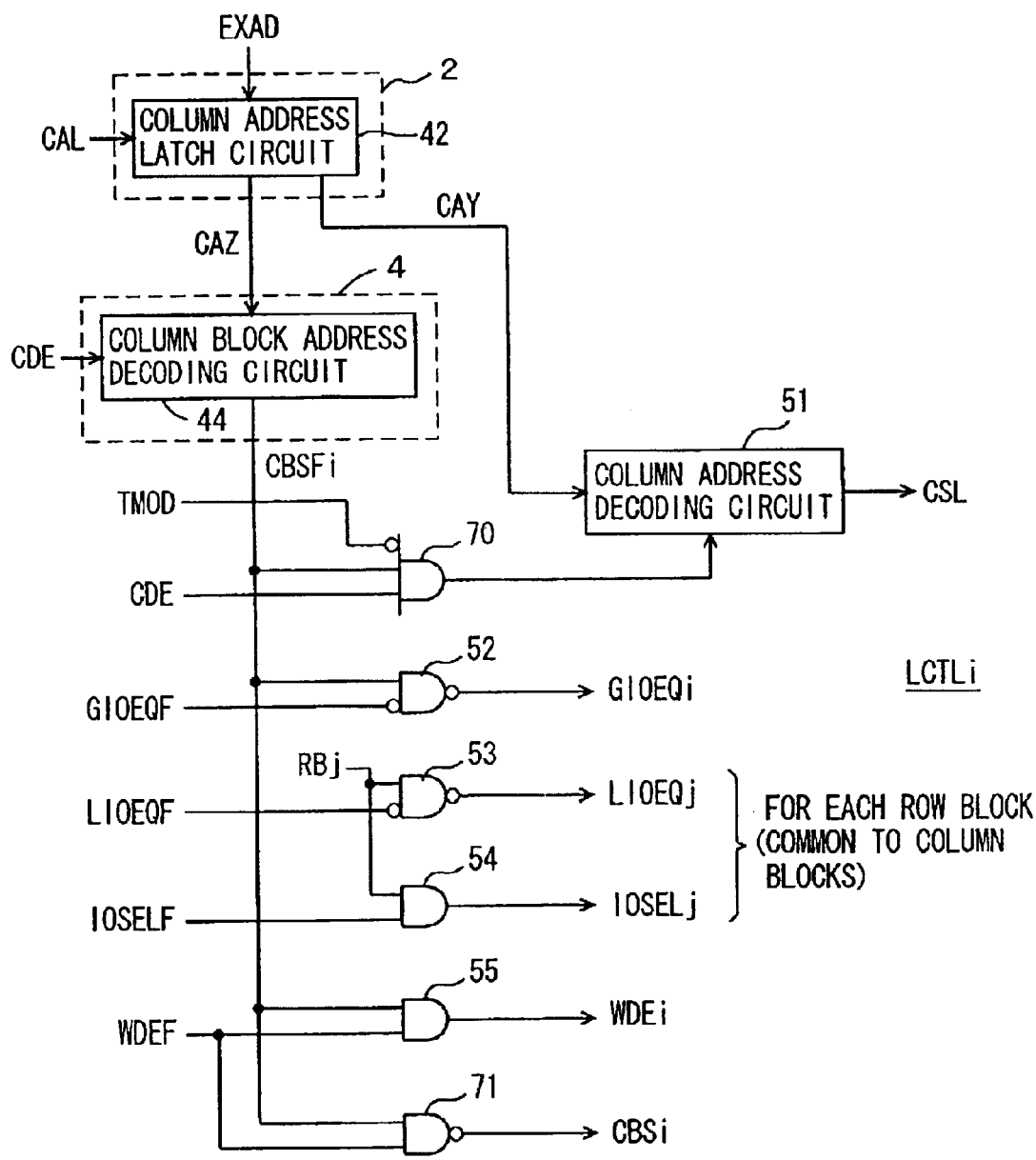
FIG. 18 is a diagram showing an example of the configuration of a local column related control circuit according to the second embodiment of the present invention.

FIG. 18 is a schematic diagram showing the configuration of local column control circuit LCTLi according to the second embodiment of the present invention. Local column control circuit LCTi shown in FIG. 18 differs from local column control circuit LCTLi shown in FIG. 10 in the following points.

Specifically, a gate circuit 70 which receives test mode signal TMOD, column block indication fast signal CBSFi and column decode enable signal CDE, is provided in place of AND circuit 50 which receives column decoding enable signal CDE. When the output signal of gate circuit 70 is activated, column address decoding circuit 51 performs a decoding operation.

In addition, a NAND circuit 71 which receives write driver fast signal WDEF and column block indication fast signal CBSFi, is provided in place of gate circuit 56 which generates column block select signal CBi. NAND circuit 71 sets column block select signal CBi at L level when write driver fast signal WDEF and column block indication fast signal CBSFi are both at H level. The global data line pull-up circuit arranged corresponding to the select write driver is deactivated.

When test mode signal TMOD is at H level, gate circuit 70 fixes the output signal thereof at L level. Therefore, column address decoding circuit 51 is prohibited from performing a column select operation while test mode signal TMOD is activated. As a result, under the state that the sense amplifier is disconnected from the local data lines, the write driver drives the local data lines and the global data lines.

If column block address decoding circuit 44 and column address decoding circuit 51 are controlled to be activated/deactivated by different control signals, the main column related control circuit may be configured to hold the enable signal to the column address decoding circuit in an inactive state while voltage stress acceleration signal TDBI is activated.

Figure 19:
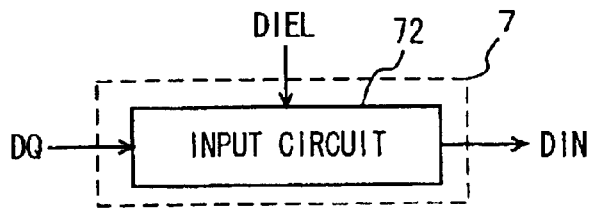
FIG. 19 is a schematic diagram showing the configuration of a main part of a data input/output circuit according to the second embodiment of the present invention.

FIG. 19 is a schematic diagram showing the configuration of data input/output circuit 7. In FIG. 19, data input/output circuit 7 includes an input circuit 72 which takes in and latches external data DQ and generates internal write data DIN when data input enable/latch signal DIEL from OR circuit 69 shown in FIG. 17 is activated. Internal write data DIN from input circuit 72 is applied to the write driver.

FIG. 20 is a timing chart representing the operations of the circuits shown in FIGS. 17 to 19. Referring to FIG. 20, a voltage stress acceleration operation according to the second embodiment will be described.

Figure 22:
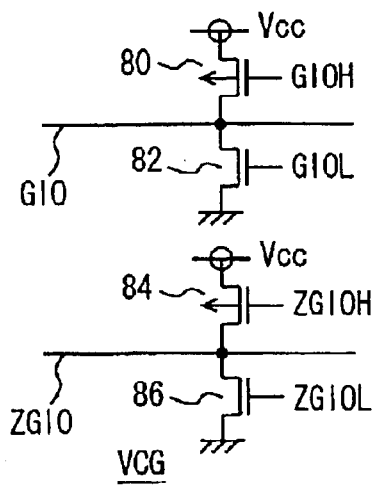
FIG. 22 is a diagram showing an example of the configuration of a voltage setting circuit shown in FIG. 21.

Under the state that test mode signal TMOD is set at H level, a column access is started and column select operation activation signal CACT is driven to an active state for a predetermined period. In accordance with the activation of column select operation activation signal CACT, set/reset flip-flop 22 shown in FIG. 22 is set and voltage stress acceleration signal TDBI is driven to an active state. In addition, in response to the activation of column select operation activation signal CACT, control circuits 23 to 27 and 65 shown in FIG. 17 operate and column address latch instruction signal CAL and column decoding enable signal CDE are driven to an active state.

Likewise, data input enable/latch instruction signal DIEL is driven to an active state, and input circuit 72 generate internal data DIN in accordance with external data DQ.

In accordance with column decoding enable signal CDE, column block indication fast signal CBSFi from column block address decoding circuit shown in FIG. 18 is driven to a selected state and global data line equalization instruction signal GIOEQi and local data line equalization instruction signal LIOEQj turns L level. In addition, IO line select signal IOSELj turns H level, so that the local data lines are connected to the global data lines.

After the activation of data input enable/latch signal DIEL, write driver enable signal WDEi is activated in accordance with column block indication fast signal CBSFi and column select operation activation signal CACT, and the write driver drives corresponding global data lines and local data lines in accordance with internal data DIN.

In this state, column block select signal CBSi outputted from NAND circuit 71 is at L level, the pull-up operations of the global data lines GIO and ZGIO are stopped, and the write driver can drive global data lines GIO and ZGIO to the power supply voltage level and the ground voltage level in accordance with the input data.

During this voltage stress acceleration, test mode signal TMOD is at H level, the output signal of gate circuit 70 shown in FIG. 18 is at L level, column address decoding circuit 51 is kept in an inactive state, and column select signal CSL is kept at L level. Accordingly, under the state that the sense amplifier is disconnected from the local data lines, the voltage stress between the complementary local/global data lines is accelerated in accordance with the complementary internal data generated by the write driver. During this acceleration operation, the power supply voltage applied to the write driver is accelerated (the voltage level thereof is boosted).

When a predetermined period elapses, a voltage stress acceleration end instruction is applied and test reset signal TRST is activated. As a result, set/reset flip-flop 22 shown in FIG. 17 is reset, and accordingly, voltage stress acceleration signal TDBI is set to an L-level inactive state, column address latch instruction signal CL and column decoding enable signal CDE are deactivated and column block indication fast signal CBSFi is driven to an L-level inactive state, accordingly.

Further, in response to the deactivation of voltage stress acceleration signal TDBI, data input enable/latch signal DIEL turns into an inactive state and write driver enable signal WDEi also turns into an inactive state, whereby internal data DIL is returned to a precharged state (L level).

Moreover, global data line equalization instruction signal GIOEQi turns H level, local data line equalization instruction signal LIOEQj turns H level, and the equalization operations for the local data lines and the global data lines are performed. IO line select signal IOSELj turns into an unselected state and the local data lines are disconnected from the global data lines.

In addition, column block select signal CBSi turns H level and global data lines GIO and ZGIO are pulled up to the predetermined voltage level by the associated pull-up circuit.

Therefore, as shown in FIG. 20, by accelerating the operating power supply voltage of the write driver, it is possible to accelerate the voltage stress between the complementary data lines in accordance with the output signal of this write driver. Since the driving capability of the write driver is sufficiently higher than that of the sense amplifier, it is possible to drive the global/local data lines to a predetermined voltage level at high speed to accelerate the voltage stresses.

In the second embodiment of the present invention as well, column block select signal CBSFi may be always set at H level in accordance with test mode signal TMOD. In all of column blocks CBK0 to CBKn, respective write drivers WRD shown in FIG. 13 can be driven to an active state and the acceleration of the voltage stresses between the complementary data lines can be simultaneously preformed on global data line pairs GIOP0 to GIOPn and local data line pairs LIOP0 to LIOPn. As a result, it is possible to further reduce the time required to accelerate the voltage stresses between the complementary data lines.

Further, if the row access instruction and the column access instruction are simultaneously applied as in the first embodiment, voltage stress acceleration signal TDBI may be applied to the row related circuits in a test mode, so that the voltage stresses between the complementary data lines can be accelerated according to the write driver, as well.

Furthermore, a plurality of local data line pairs may be simultaneously connected to one global data line pair. In this case, during the voltage stress acceleration test on the data line pairs, by simultaneously setting a predetermined number of row blocks into a selected state, it is possible to connect the corresponding local data line pairs to the corresponding global data line pair. However, in a shared sense amplifier arrangement in which a sense amplifier is shared between adjacent row blocks, it is configured for the row blocks sharing the sense amplifier not to be simultaneously driven to a selected state. The row selection is only required to specify a row block. If no problem occurs even when data stored in the memory cells are destructed, a plurality of row blocks at arbitrary positions may be simultaneously driven to a selected state.

Additionally, even a semiconductor memory device to which a row access indication and a column access indication are simultaneously applied, can provide the same advantages only by prohibiting the column selection operation as in the embodiments described above.

As stated so far, according to the second embodiment of the present invention, the sense amplifier is disconnected from the local data lines and the voltage stress between the complementary data lines, i.e., the voltage stress between the global/local data line pairs is accelerated according to the write driver. In this case, therefore, as in the first embodiment, it is possible to continuously maintain the write driver in an active state and to reduce time required to perform the inter-lines voltage stress acceleration test, due to no need to repeatedly write data.

Third Embodiment

Figure 21:
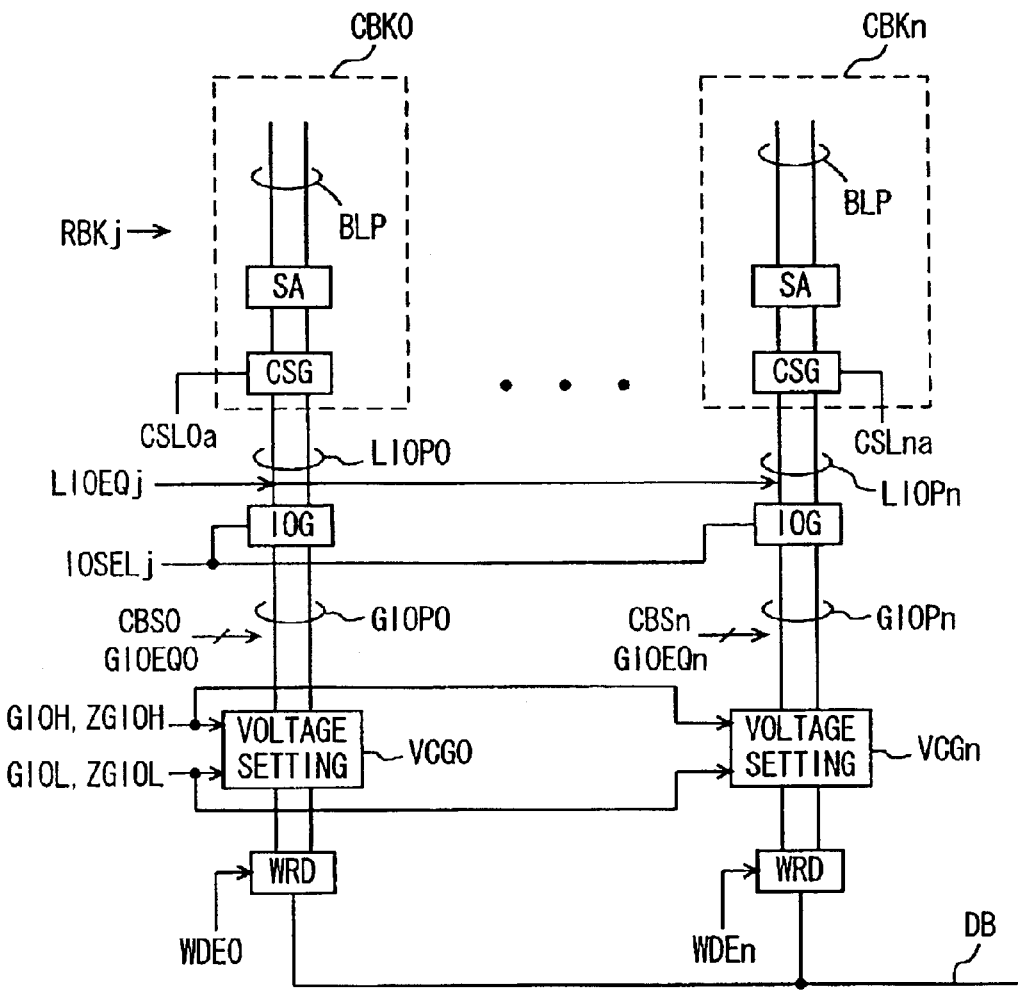
FIG. 21 is a schematic diagram showing the configuration of a main part of a semiconductor memory device according to a third embodiment of the present invention.

FIG. 21 is a schematic diagram showing the configurations of a main part of a semiconductor memory device according to the third embodiment of the present invention. In FIG. 21, voltage setting circuits VCG0 to VCGn which set the corresponding global data lines at the power supply voltage level or ground voltage level, or a voltage level of complementary data in accordance with voltage control signals GIOH, ZGIOH, GIOL and ZGIOL, are arranged for global data line pairs GIOP0 to GIOPn, respectively. The remaining configuration shown in FIG. 21 is the same as that shown in FIG. 13. Corresponding components are denoted by the same reference numerals, and will not be described herein in detail.

In the configuration shown in FIG. 21, the global data lines of each of global data line pairs GIOP0 to GIOPn are set at complementary voltage levels in parallel by voltage setting circuits VCG0 to VCGn, respectively. Thus, it is possible to simultaneously apply voltage stresses between the complementary data lines with respect to a plurality of global data line pairs. When the voltage stresses are applied, IO select gates IOG in all of the column blocks are all set in a conductive state, and in addition, column select gates CSG are all set in a nonconductive state in all of the column blocks as in the second embodiment.

FIG. 22 is a diagram showing an example of the configuration of voltage setting circuits VCG0 to VCGn shown in FIG. 21. Since voltage setting circuits VCG0 to VCGn are the same in configuration, a voltage setting circuit VCG is representatively shown in FIG. 22.

In FIG. 22, voltage setting circuit VCG includes: a P-channel MOS transistor 80 which is rendered conductive when a voltage setting signal GIOH is at L level and transmits power supply voltage Vcc to global data line GIO when conductive; an N-channel MOS transistor 82 which is rendered conductive when a voltage setting signal GIOL is at H level, for driving global data line GIO to the ground potential level; a P-channel MOS transistor 84 which is rendered conductive when a voltage setting signal ZGIOH is at L level, for transmitting power supply voltage Vcc to complementary global data line ZGIO; and an N-channel MOS transistor 86 which is rendered conductive when a voltage setting signal ZGIOL is at H level, for setting complementary global data line ZGIO at the ground voltage level.

Figure 23:
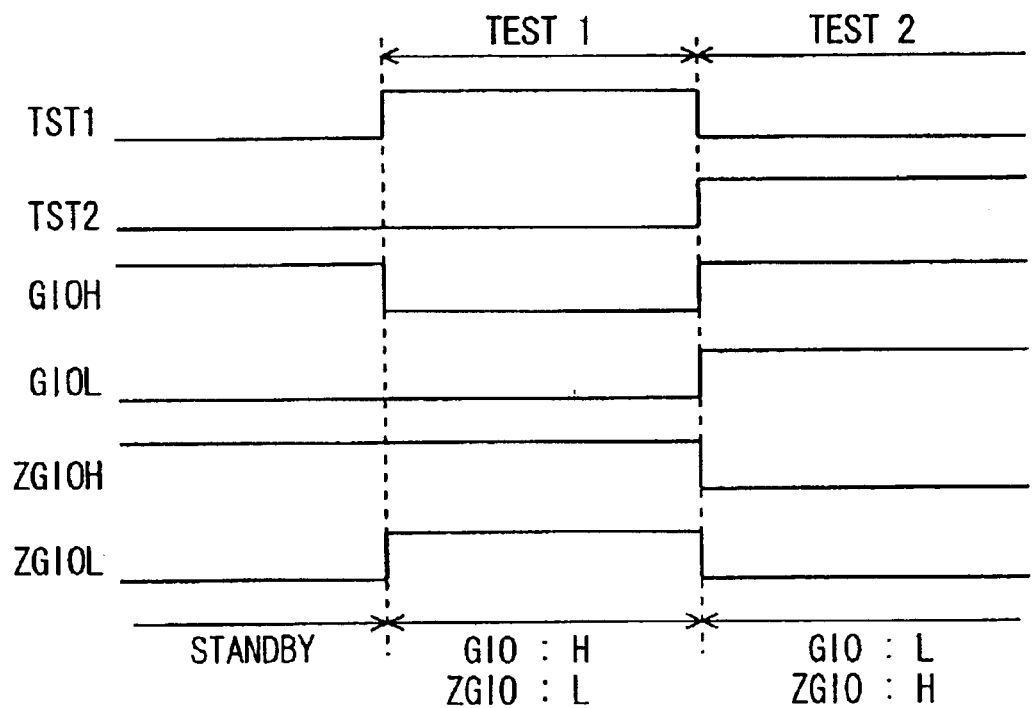
FIG. 23 is a timing chart representing an operation of the voltage setting circuit shown in FIG. 22.

FIG. 23 is a timing chart representing an operation of the voltage setting circuit shown in FIG. 22. Referring to FIG.

23, the operation of the voltage setting circuit shown in FIG. 22 will now be briefly described.

In a standby state prior to column selection, voltage setting signals GIOH and ZGIOH are at H level and voltage setting signals GIOL and ZGIOL are at L level. MOS transistors 80, 82, 84 and 86 are, therefore, all in a non-conductive state. In this state, global data lines GIO and ZGIO are pulled up to and equalized at the power supply voltage level by the global data line equalization transistor and the pull-up circuit.

In a test operation, two test periods are prepared and executed.

In a test 1 period, voltage setting signals GIOH and GIOL are both set at L level and voltage setting signals ZGIOH and ZGIOL are both set at H level. Therefore, MOS transistors 80 and 86 are turned on, MOS transistors 82 and 84 are turned off, global data line GIO attains power supply voltage Vcc level, and complementary global data line ZGIO attains the ground voltage level. Under this state, power supply voltage Vcc is accelerated.

In a test 2 period, voltage setting signals GIOH and GIOL are both set at H level and voltage setting signals ZGIOH and ZGIOL are both set at L level. In this state, MOS transistors 82 and 84 are turned on and MOS transistors 80 and 86 are turned off. Therefore, global data line GIO is kept at the ground voltage level by MOS transistor 82 and complementary global data line ZGIO is set at power supply voltage Vcc level. Voltage acceleration is performed under this state.

By selectively turning on MOS transistors 80, 82, 84 and 86 by voltage setting signals GIOH, GIOL, ZGIOH and ZGIOL, it is possible to transmit the complementary data to global data lines GIO and ZGIO. By setting the current driving capabilities of MOS transistors 80, 82, 84 and 86 to be sufficiently high, it is possible to set the global data lines at predetermined voltage levels. In this state, IO select gate IOG is selectively set in a conductive state in accordance with a row block select signal, and voltage stress between the local data lines of the selected row block is accelerated by MOS transistors 80, 82, 84 and 86.

Figure 24:
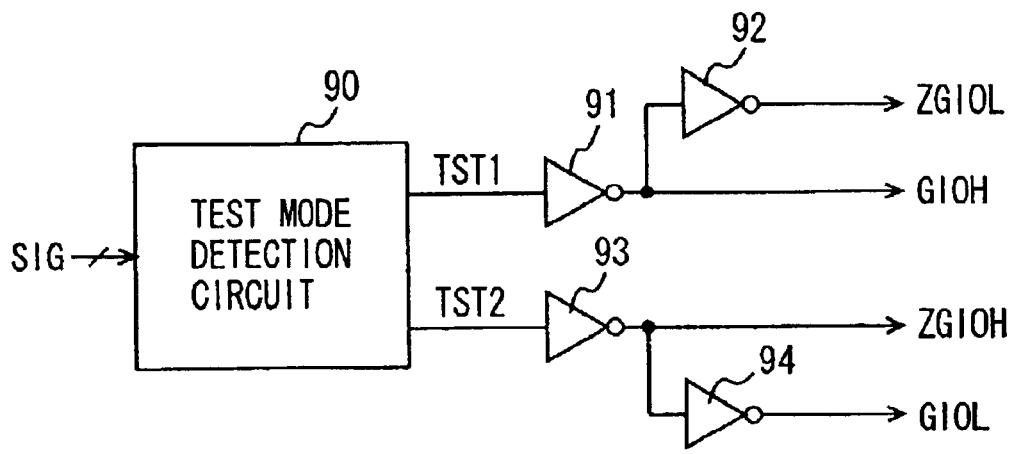
FIG. 24 is a diagram showing an example of the configuration of a voltage setting signal generating section shown in FIG. 22.

FIG. 24 is a schematic diagram showing an example of the configuration of a section for generating the voltage setting signals shown in FIG. 22. In FIG. 24, a voltage setting signal generation circuit includes: a test mode detection circuit 90 which selectively activates test mode instruction signals TST1 and TST2 in accordance with a signal SIG of a predetermined number of bits; an inverter 91 which inverts test mode instruction signal TST1 and outputs voltage setting signal GIOH; an inverter 92 which inverts the output signal of inverter 91 and generates voltage setting signal ZGIOL; an inverter 93 which inverts test mode instruction signal TST2 and generates voltage setting signal ZGIOH; and an inverter 94 which inverts the output signal of inverter 93 and generates voltage setting signal GIOL.

Test mode detection circuit 90 selectively activates test mode instruction signals TST1 and TST2 in accordance with, for example, the timing relation, a combination of logic levels, a super Vcc condition or the like of the plurality of bits of signal SIG. It suffices to satisfy an appropriate condition so as to activate test mode instruction signals TST1 and TST2.

When test mode instruction signal TST1 is in an H-level, active state, test mode instruction signal TST2 is in an inactive state. These test mode instruction signals TST1 and TST2 are alternatively activated. When test mode instruction signal TST1 is activated, voltage setting signal ZGIOL is set at H level. Since test mode instruction signal TST2 is at L level, voltage setting signal ZGIOH is at H level. In addition, voltage setting signals GIOH and GIOL are both at L level. As a result, it is possible to set global data line GIO at H level and global data line ZGIO at L level.

When test mode instruction signal TST2 is at H level, voltage setting signal GIOH is set at L level and voltage setting signal GIOL is set at L level. Since test mode instruction signal TST1 is at L level, voltage setting signal GIOH is at H level and voltage setting signal ZGIOL is at L level. As a result, it is possible to set global data line GIO at L level and global data line ZGIO at H level.

Figure 25:
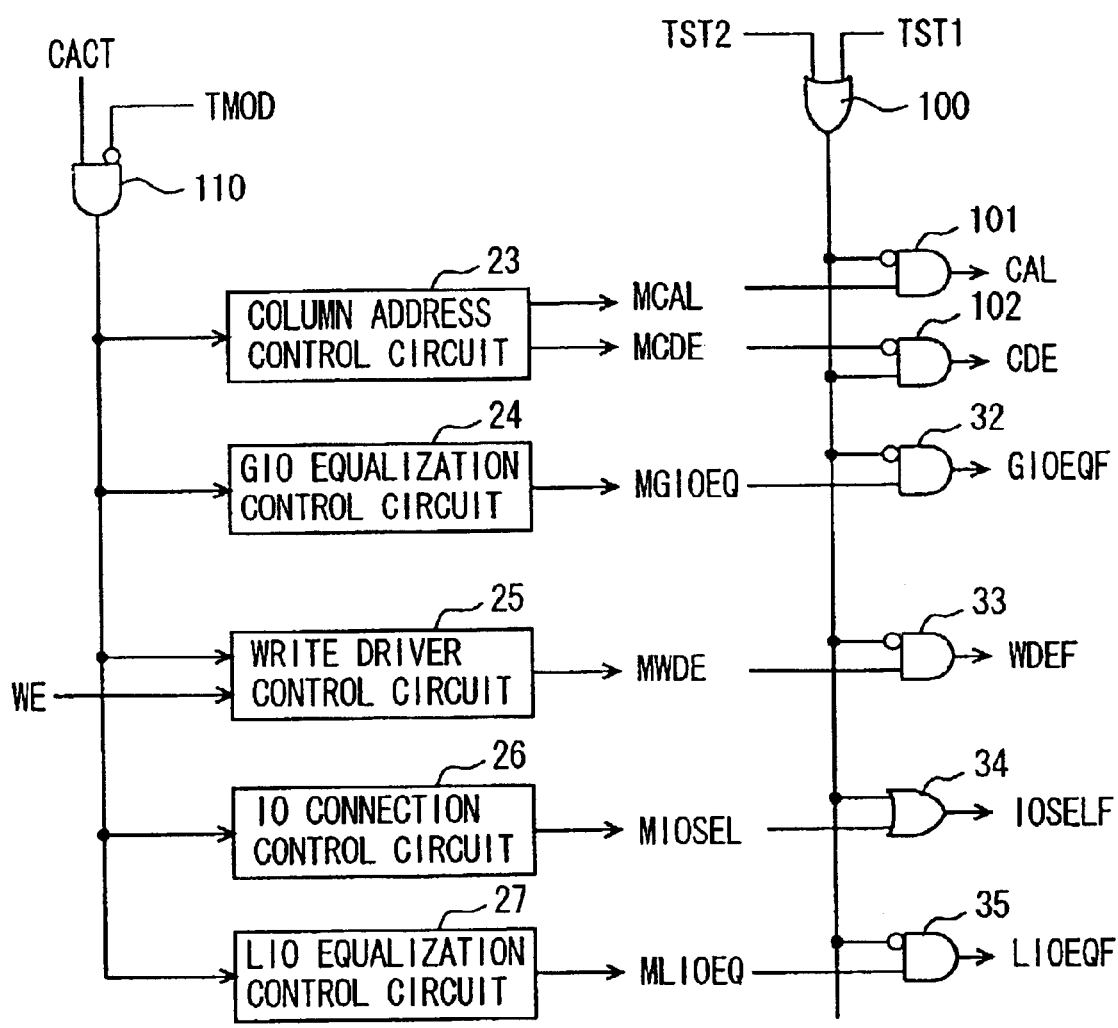
FIG. 25 is a diagram showing an example of the configuration of a main column related control circuit according to the third embodiment of the present invention.

FIG. 25 is a schematic diagram showing the configuration of main column related control circuit 14 according to the third embodiment of the present invention. Main column related control circuit 14 shown in FIG. 25 differs from main column related control circuit 14 shown in FIG. 7 in the following points. Specifically, the output signal of a gate circuit 110 which receives column select operation activation signal CACT and test mode signal TMOD is applied to each of control circuits 23 to 27 generating main column related control signals. When test mode signal TMOD is active (at H level), gate circuit 110 outputs an L-level signal and holds control circuits 23 to 27 all in a precharged state.

Further, main column related control circuit 14 includes: an OR circuit 100 which receives test mode instruction signals TST1 and TST2; a gate circuit 101 which receives the output signal of OR circuit 100 and main column address latch instruction signal MCAL from column address control circuit 23 and generates column address latch signal CAL; and a gate circuit 102 which receives the output signal of OR circuit 100 and main column decoding enable signal MCDE and generates column decoding enable signal CDE. The remaining construction of main column related control circuit 14 shown in FIG. 25 is the same as that shown in FIG. 7. Corresponding components are denoted by the same reference numerals as those shown in FIG. 7, and will not be described herein in detail.

In main column related control circuit 14 shown in FIG. 25, test mode signal TMOD is at H level and control circuits 23 to 27 are all in a precharged state in a test mode in which the voltage stress between the complementary data lines is accelerated.

When a test mode is designated and one of test mode instruction signals TST1 and TST2 is activated, the output signal of OR circuit 100 becomes H level. Accordingly, gate circuits 101 and 102 fix column address latch instruction signal CAL and column decoding enable signal CDE to L level, respectively. Therefore, a column select operation and a column block selection operation are not performed. Further, global data line equalization fast signal GIOEQF, write driver enable fast signal WDEF and local data line equalization fast signal LIOEQF are driven to L level as well. IO line select fast signal IOSELF is driven to H level.

In the local column related circuit shown in FIG. 10, therefore, IO line select signal IOSELj arranged corresponding to a selected row block turns on or active in accordance with row block select signal RBj, and the local data lines provided for this selected row block are all connected to the corresponding global data lines. In addition, the equalization operation of the respective local data lines, the equalization and pull-up operations of the global data lines are stopped. In this state, the voltage setting signals are generated from the circuit shown in FIG. 24, and global data lines GIO and ZGIO are set at predetermined voltage levels, respectively.

Gate circuit 110 is used for stopping a column select operation, and the row selection operation is preformed for generating row block select signal RBj. If all of the row blocks are set in a selected state, a configuration for driving row block select signal RBj to a selected state in accordance with the output signal of OR circuit 100 is simply utilized. Accordingly, all the row blocks can be set in a selected state to connect all the local data lines to the corresponding global data lines.

Alternatively, it is possible to use a configuration in which a predetermined row address signal bit is set in a degenerated state, to select a plurality of row blocks simultaneously, for connecting a plurality of local data line pairs one global data line pair.

Furthermore, a configuration may be employed, in which upon activation of test mode signal TMOD, an operation for generating row block select signal RBj is simply performed and a row select operation per se is stopped. In a normal DRAM, row address latch instruction signal RAL and row address decoding enable signal RADE are activated while the remaining word line activation signal, sense amplifier activation signal and bit line equalization instruction signal are all kept in a standby state. Accordingly, it is possible to designate a row block simply in accordance with an address applied externally and to drive the global data lines to a predetermined voltage level using the transistors shown in FIG. 22 in a test mode.

In addition, in the configuration described above, the local data lines arranged corresponding to a row block are simultaneously connected to the global data line pairs and the voltage stress is accelerated. Alternatively, the voltage stress acceleration may be executed on a column block basis. In this case, the same configuration as that of the local column related control circuit shown in FIG. 18 can be utilized. As for the voltage setting signals, column block select fast signal CBSFi and test mode instruction signals TST1 and TST2 are combined. It becomes possible to apply voltage stress between the global data lines on a column block basis. As for the semiconductor memory device, a row access instruction for row selection and a column access instruction for column selection may be applied concurrently.

As stated so far, according to the third embodiment of the present invention, the voltage stress between the data lines of the internal data lines (local/global data lines) is applied using the transistors provided to the global data line pair. Thus, it is possible to continuously apply voltage stresses between the complementary data lines of the local/global data lines and to reduce time required to accelerate the voltage stress between the complementary data lines.

If the voltage stress between the global data line pair and the like is accelerated, IO line select signal IOSLEFL is kept in an inactive state all the time in this test mode. Thus, the voltage stress between the complementary data lines of the global data line pair can be accelerated.

In the above description, the dynamic random access memory is described. However, the configurations described in the second and third embodiments can be applied to any semiconductor memory device, provided that data is through complementary data lines in the memory device.

Furthermore, in the first to third embodiments described above, write data and read data are transmitted through common internal data lines. However, the present invention is also applicable to a semiconductor memory device which transmits the write data and read data through separate internal data lines. In the case of such a separated IO configuration, the first or third embodiment is applied to the internal data read line and the second or third embodiment is applied to the internal data write line.

As described so far, according to the present invention, the semiconductor memory device is configured to continuously apply voltage stress to the internal data lines, so that it becomes possible to reduce the time required to perform an inter-line voltages stress accelerating test of accelerating a voltage stress between complementary data lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns;
   a plurality of sense amplifiers arranged corresponding to the columns of the memory cells, and sensing and amplifying data of the memory cells in corresponding columns when activated;
   column selection control circuitry for holding a column select instruction signal in an active state in accordance with a test operation mode instruction signal, and generating said column select instruction signal in a one-shot pulse form in accordance with a column access instruction signal in a normal operation mode when said test operation mode instruction signal is deactivated;
   column selection circuitry for connecting the sense amplifier arranged corresponding to a selected column to an internal data bus in response to said column select instruction signal;
   write circuitry for driving said internal data bus in accordance with a write instruction signal; and
   write control circuitry for holding said write instruction signal in an inactive state when said test operation mode instruction signal is activated.

2. The semiconductor memory device according to claim 1, wherein
   said plurality of memory cells are divided into a plurality of column blocks each including a plurality of memory cells,
   said internal data bus includes a plurality of internal data line pairs arranged corresponding to the column blocks, and
   said column selection control circuitry generates said column select signal so as to select a column in a predetermined number of column blocks among said plurality of blocks when said test operation mode instruction signal is activated with said predetermined number being at least two, and generates said column select signal so as to select a column in a prescribed number of column blocks out of the column blocks in accordance with said column select signal when said test operation mode instruction signal is deactivated, with said prescribed number being smaller than said predetermined number.

3. The semiconductor memory device according to claim 1, wherein
   said column selection control circuitry generates said column select signal so as to concurrently select a plurality of columns and to connect selected columns to said internal data bus when said test operation mode instruction signal is activated.

4. A semiconductor memory device comprising:
   a plurality of memory cells arranged in rows and columns;
   an internal data bus for transmitting and receiving data to and from a selected memory cell among said plurality of memory cells;

write circuitry for driving said internal data bus in response to a write instruction signal;

write control circuitry for holding said write instruction signal in an active state in accordance with a test operation mode instruction signal, and activating said write instruction signal in a one-shot pulse form in response to a write operation mode instruction signal when said test operation mode instruction signal is deactivated;

a plurality of sense amplifiers arranged corresponding to the columns of said memory cells, and sensing and amplifying data of the memory cells read to corresponding columns when activated;

column select circuits arranged corresponding to the plurality of sense amplifiers, and connecting a sense amplifier arranged corresponding to a selected column to said internal data bus in accordance with a column select signal; and column selection control circuitry for holding said column select signal in an inactive state in accordance with said test operation mode instruction signal.

5. The semiconductor memory device according to claim 4, wherein said plurality of memory cells are divided into a plurality of column blocks each including a plurality of memory cells, said internal data bus includes a plurality of internal data line pairs arranged corresponding to the column blocks, said write circuitry includes a plurality of write drivers arranged corresponding to the internal data line pairs, and said write control circuitry activates the write drivers for a greater number of column blocks when said test operation mode instruction signal is activated than when said test operation mode instruction signal is deactivated.

6. A semiconductor memory device comprising:

a plurality of memory cells arranged in rows and columns;

an internal data bus for transmitting and receiving data to and from a selected memory cell among said plurality of memory cells;

voltage setting circuitry coupled to said internal data bus, selectively activated in accordance with a test operation mode instruction signal, and holding said internal data bus at a predetermined voltage level when activated; and voltage holding circuitry for holding said internal data bus at a prescribed voltage level when an access instruction signal, instructing selection of said selected memory cell, is deactivated when said test operation mode instruction signal is deactivated.

7. The semiconductor memory device according to claim 6, wherein said plurality of memory cells are divided into a plurality of row blocks, and said internal data bus includes a global data line pair arranged in common to said plurality of row blocks.

8. The semiconductor memory device according to claim 6, further comprising column selection control circuitry for prohibiting a memory cell column selection operation of selecting a column of memory cells out of the columns when said test operation mode instruction signal is activated.

9. The semiconductor memory device according to claim 6, wherein said internal data bus includes a data line pair transmitting complementary data, and said voltage setting circuitry sets data lines of said complementary data line pair at voltage levels having different logic levels, respectively, when activated.

10. The semiconductor memory device according to claim 6, wherein said plurality of memory cells are divided into a plurality of sub-blocks, the sub-blocks arranged in alignment in a row direction constituting a row block, the sub-blocks arranged in alignment in a column direction constitute a column block, said internal data bus includes a plurality of local data line pairs arranged corresponding to the sub-blocks, and a plurality of global data line pairs arranged corresponding to the column blocks, and said semiconductor memory device further comprises:

block selection circuitry for selectively connecting the local data line pairs to the global data line pairs; and block selection control circuitry for generating a block select signal so as to connect the local data line pair to the global data line pairs on a row block basis in response to said test operation mode instruction signal, and applying the generated block select signal to said block selection circuitry.

11. The semiconductor memory device according to claim 10, wherein said voltage setting circuitry includes a plurality of voltage setting elements arranged corresponding to said global data line pairs, and, said voltage setting circuitry simultaneously set said plurality of global data line pairs at voltage levels of different logic levels when said test operation mode instruction signal is activated.

* * * * *